(12) United States Patent
You

(10) Patent No.: US 7,968,387 B2
(45) Date of Patent: Jun. 28, 2011

(54) THIN FILM TRANSISTOR AND METHOD OF FABRICATING THIN FILM TRANSISTOR SUBSTRATE

(75) Inventor: Chun Gi You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/685,200

(22) Filed: Jan. 11, 2010

(65) Prior Publication Data

US 2010/0136754 A1    Jun. 3, 2010

Related U.S. Application Data

(63) Continuation of application No. 11/350,382, filed on Feb. 8, 2006, now Pat. No. 7,667,287.

(30) Foreign Application Priority Data

May 31, 2005  (KR) .......................... 10-2005-0045936

(51) Int. Cl.
  *H01L 21/00* (2006.01)
(52) U.S. Cl. .......... 438/157; 257/E21.411; 257/E21.421
(58) Field of Classification Search .................. 438/157; 257/E21.411, E21.421
  See application file for complete search history.

(56) References Cited

U.S. PATENT DOCUMENTS

| 6,617,644 B1 * | 9/2003 | Yamazaki et al. ............ 257/347 |
| 6,773,996 B2 * | 8/2004 | Suzawa et al. ................ 438/279 |
| 2002/0105033 A1 | 8/2002 | Zhang |
| 2002/0149056 A1 * | 10/2002 | Ohtani et al. ................ 257/350 |

* cited by examiner

*Primary Examiner* — Charles D Garber
*Assistant Examiner* — Stanetta D Isaac
(74) *Attorney, Agent, or Firm* — F. Chau & Associates, LLC

(57) ABSTRACT

Provided are a thin film transistor (TFT) capable of increasing ON current and decreasing OFF current values, a TFT substrate having the polysilicon TFT, a method of fabricating the polysilicon TFT, and a method of fabricating a TFT substrate having the polysilicon TFT. The polysilicon TFT substrate includes a gate line and a data line defining a pixel region, a pixel electrode formed in the pixel region, and a TFT including a gate electrode connected to the gate line, a source electrode connected to the data line, a drain electrode connected to the pixel electrode, and a polysilicon active layer forming a channel between the source and drain electrodes. The polysilicon active layer includes a channel region on which the gate electrode is superposed, source and drain regions connected to the source and drain electrode, respectively, and at least two lightly doped drain (LDD) regions y formed between the source region and the channel region and between the drain region and the channel region. The LDD regions have an impurity concentration different from each other.

11 Claims, 28 Drawing Sheets

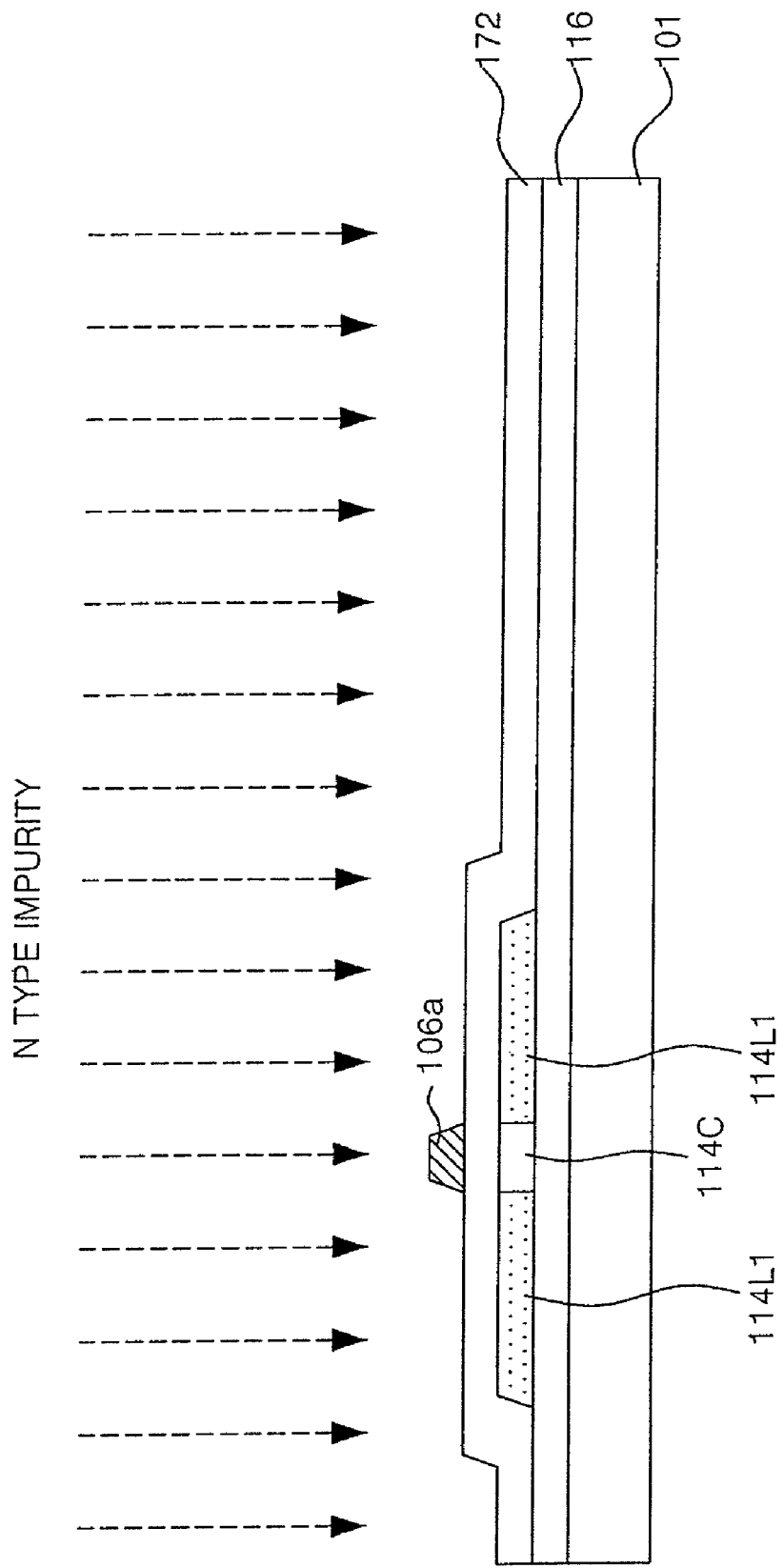

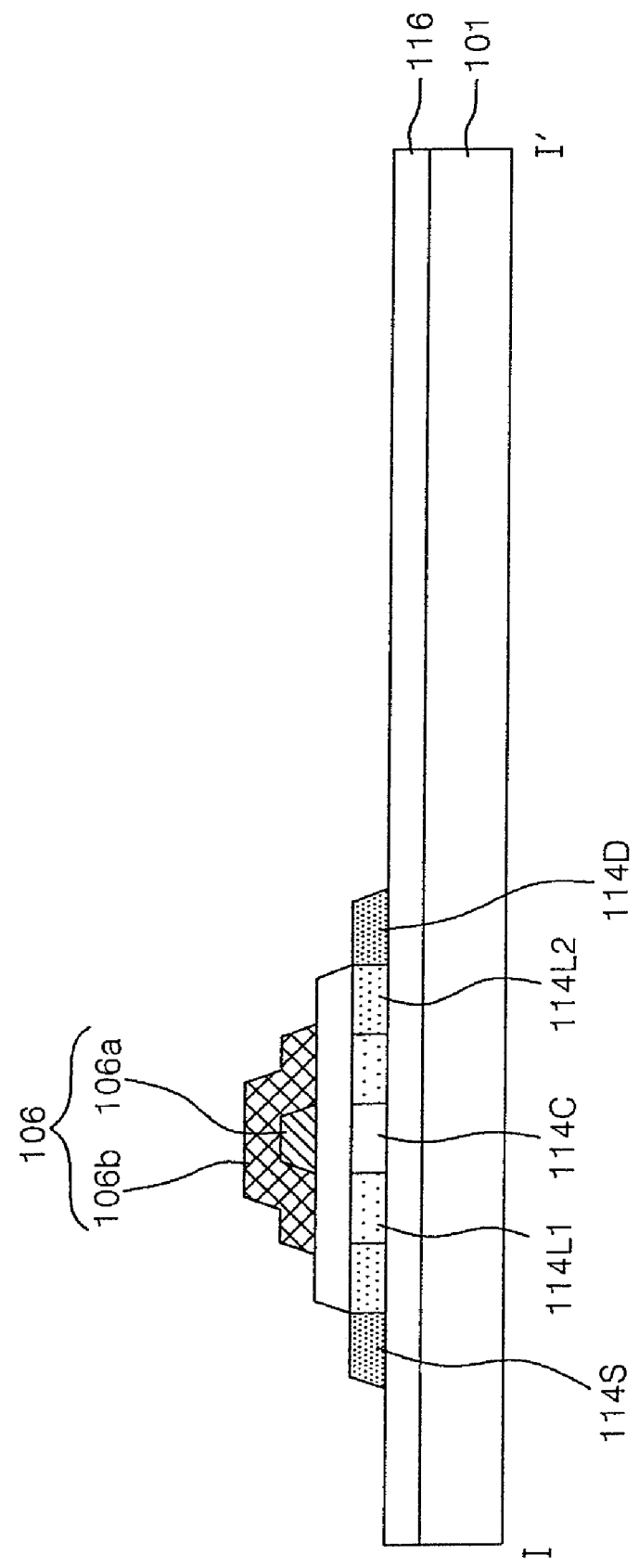

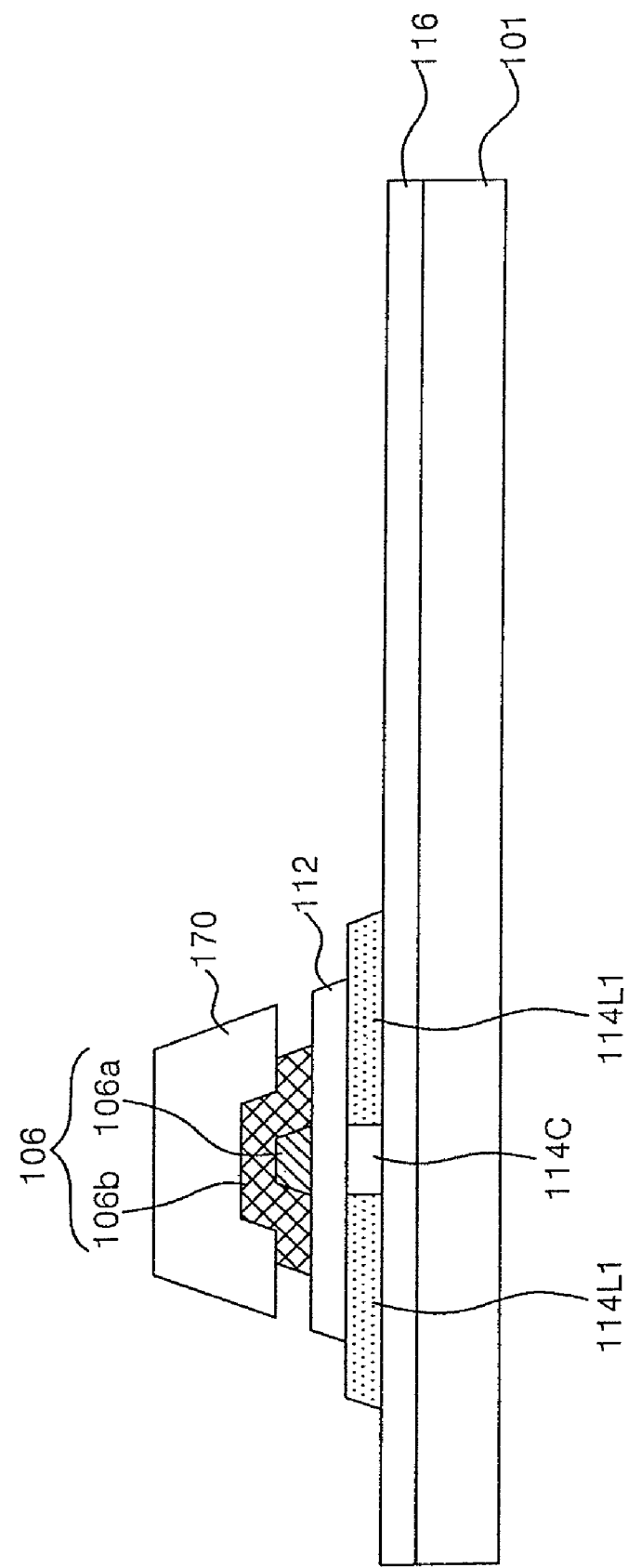

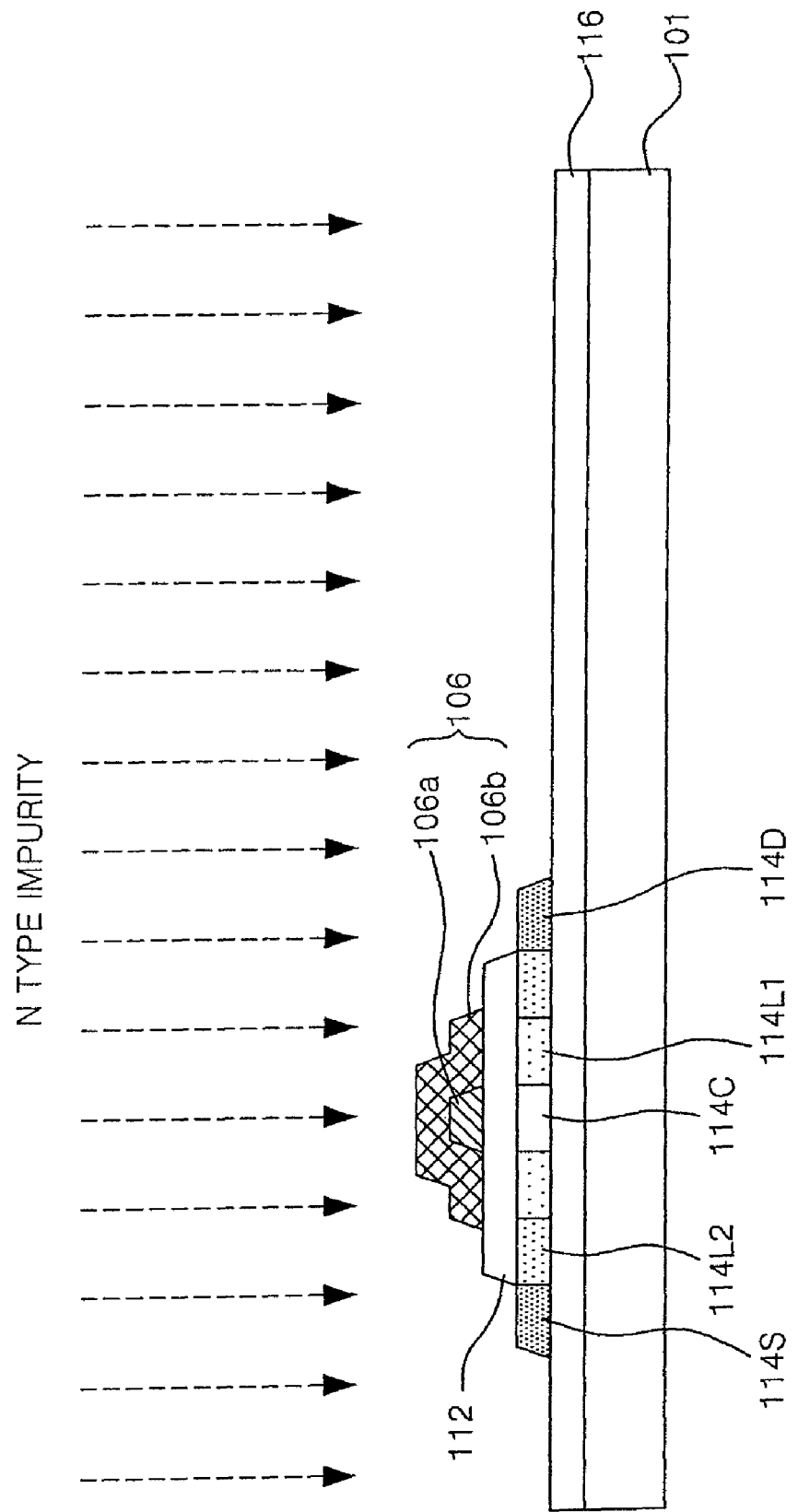

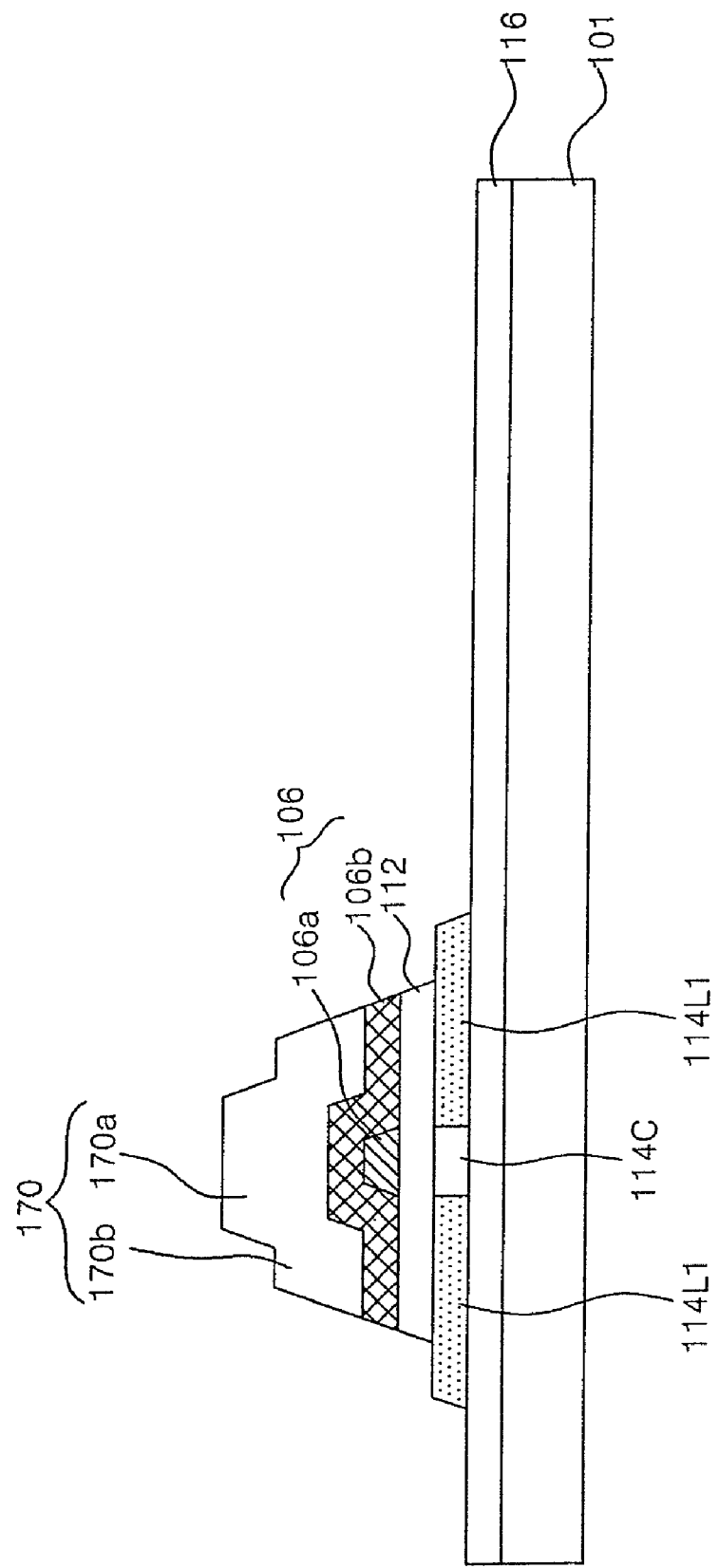

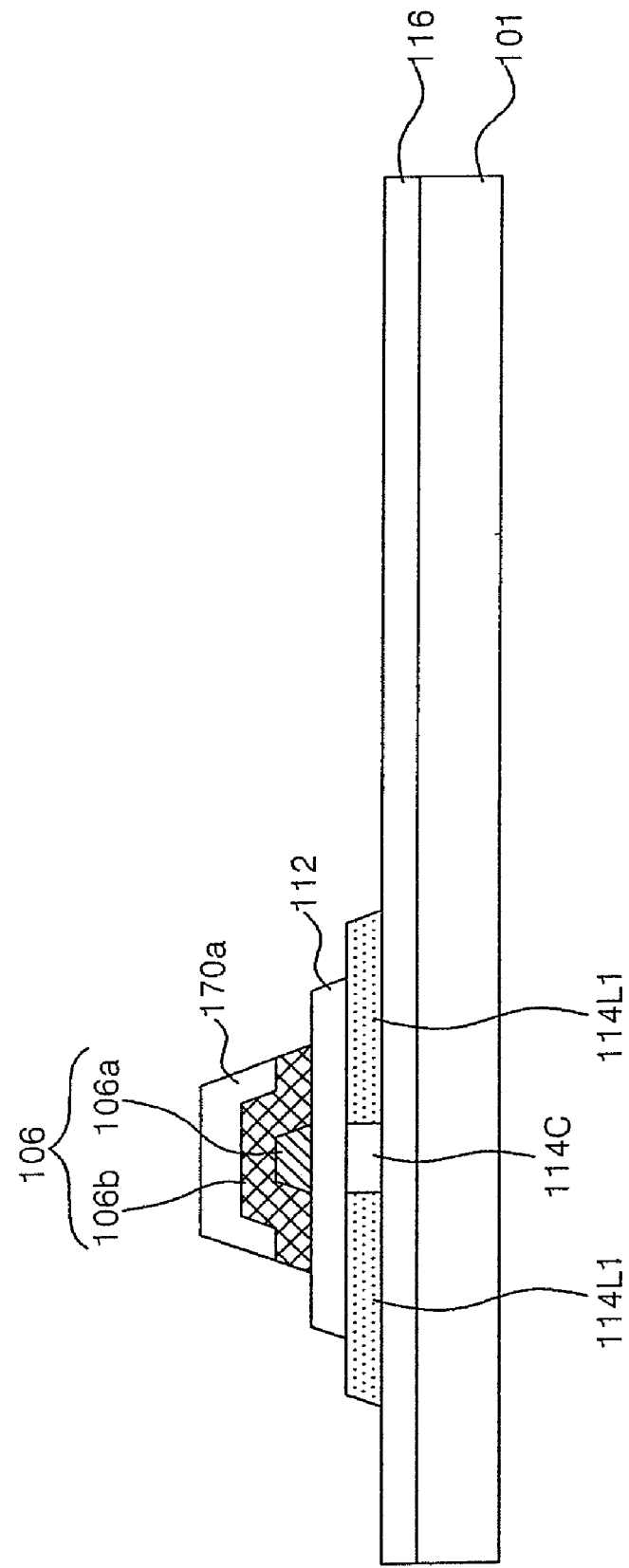

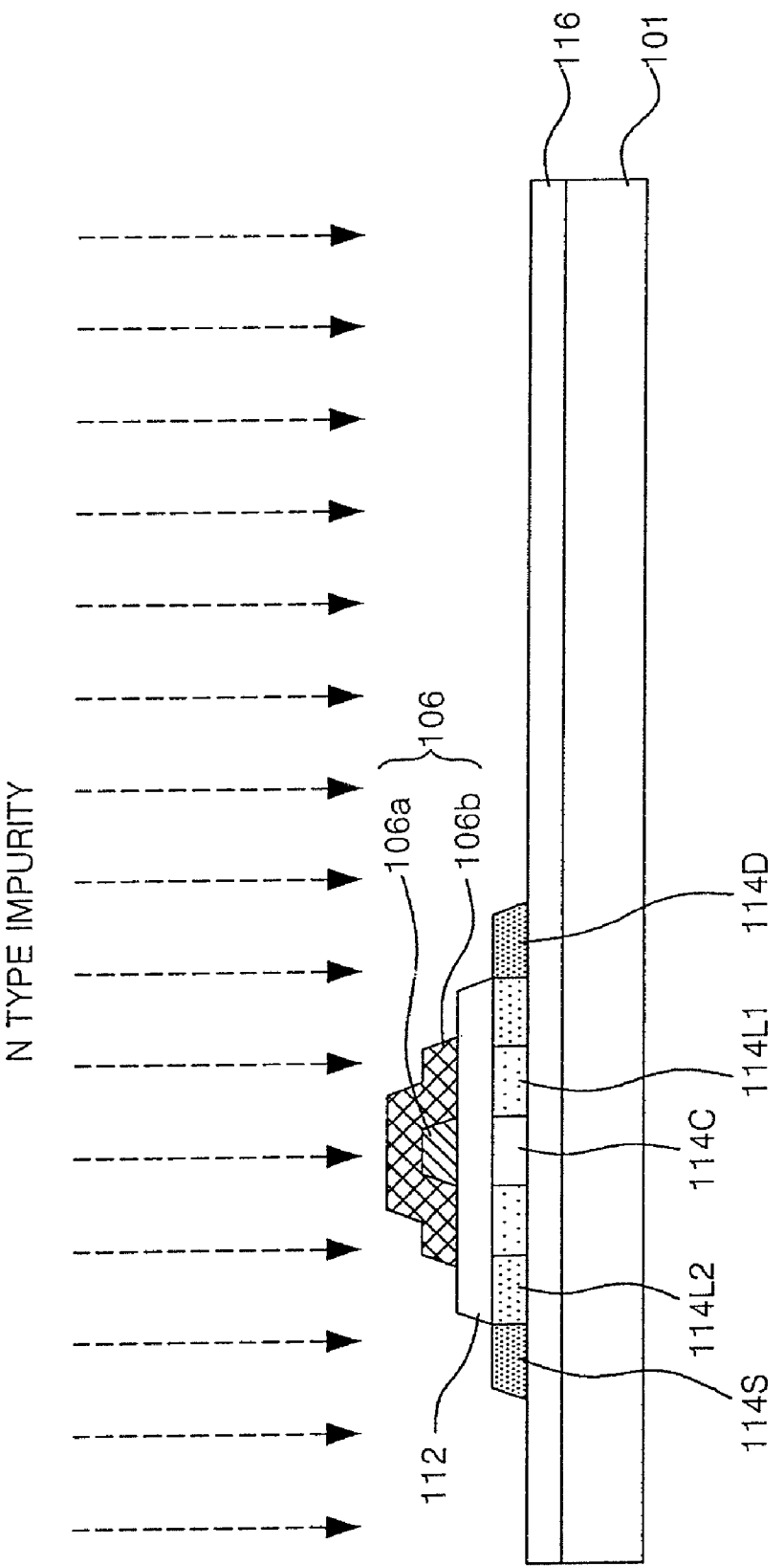

THIN FILM TRANSISTOR AND METHOD OF FABRICATING THIN FILM TRANSISTOR SUBSTRATE

CROSS-REFERENCE TO RELATED APPLICATION

This application is a continuation of application Ser. No. 11/350,382, filed on Feb. 8, 2006 now U.S. Pat. No. 7,667,287, which claims priority to Korean Patent Application No. 2005-45936, filed on May 31, 2005, the disclosures of which are each incorporated herein by reference in their entireties.

BACKGROUND OF THE INVENTION

1. Field of the Invention

The present invention relates to a thin film transistor of a liquid crystal display panel, and more particularly, to a thin film transistor capable of increasing ON current and decreasing OFF current values, a thin film transistor substrate having the same, and a method of fabricating the same.

2. Description of the Related Art

A liquid crystal display (LCD) apparatus typically displays an image via liquid crystal cells arranged in a matrix format on a liquid crystal display panel controlling light transmissivity in response to a video signal. Each of the liquid crystal cells uses a thin film transistor (TFT) as a switching element for independently providing a video signal. The TFT uses an amorphous silicon layer or a polysilicon layer as its active layer. When a polysilicon layer is used as the active layer of the TFT, a driving circuit requiring a high response speed can be used for the liquid crystal display panel because electric charge mobility of polysilicon is approximately a hundred times greater than that of amorphous silicon.

FIG. 1 roughly illustrates a conventional LCD panel using a polysilicon TFT. Referring to FIG. 1, the LCD panel includes an image display part 96 including a liquid crystal cell matrix, a data driver 92 for driving data lines 4 of the image display part 96, and a gate driver 94 for driving gate lines 2 of the image display part 96.

The image display part 96 has liquid crystal cells LC arranged in a matrix format to display images. Each of the liquid crystal cells LC has a TFT 30 connected to a corresponding gate line 2 and data line 4. The TFT 30 charges a video signal from the data line 4 in the liquid crystal cell LC in response to a scan signal of the gate line 2. The liquid crystal cell controls light transmissivity in a manner such that liquid crystals having dielectric anisotropy respond to the charged video signal for representing gray scales.

The gate driver 94 sequentially drives the gate lines 2. Moreover, the data driver 92 provides a video signal to the data lines 4 when the gate lines 2 are driven.

The above-described LCD panel is constructed in such a manner that a TFT substrate on which the TFT 30 of the liquid crystal cell LC, the data driver 92 and gate driver 94 are formed is bonded to a color filter substrate on which a common electrode and a color filter are formed, with a liquid crystal layer being disposed therebetween.

A conventional TFT is decreased in size as the resolution of the LCD panel employing the TFT is increased. However, there are certain difficulties associated with conventional TFT's such as when the size of a conventional TFT is reduced, the channel length of the TFT is also decreased, resulting in the reliability of the TFT being deteriorated as well. For example, with conventional TFT's, a hot carrier stress in a gate insulating layer is generated when electrons are accelerated from a source region to a drain region, thereby reducing electron mobility. Further, a depletion region is formed in the vicinity of the drain region of the active layer due to an electric field formed between gate and drain electrodes so as to change an energy band within the LCD apparatus. Moreover, the above depletion region further increases as the electric field between the gate and drain electrodes increases, thereby resulting in a high electric field being applied between the gate and drain electrodes to generate gate induced drain leakage (GIDL). GIDL refers to the occurrence of an increase in current caused by band tunneling of electrons.

Due to the above described GIDL and hot carrier stress, a conventional polysilicon TFT substrate generates a typical short channel effect that decreases a source/drain breakdown voltage and a threshold voltage and also increases swing of the LCD apparatus.

SUMMARY OF THE INVENTION

According to an exemplary embodiment of the present invention, there is provided a TFT substrate comprising a gate line and a data line defining a pixel region, a pixel electrode formed in the pixel region, and a TFT including a gate electrode connected to the gate line, a source electrode connected to the data line, a drain electrode connected to the pixel electrode, and a polysilicon active layer forming a channel between the source electrode and drain electrode. The polysilicon active layer includes a channel region on which the gate electrode is superposed, source and drain regions connected to the source and drain electrode, respectively; and at least two LDD regions formed between the source region and the channel region and between the drain region and the channel region. The LDD regions have an impurity concentration different from each other.

According to another exemplary embodiment of the present invention, there is provided a TFT comprising a polysilicon active layer including a channel region, source and drain regions opposite to each other having the channel region between them, and at least two LDD regions formed between the source region and the channel region and between the drain region and the channel region. The LDD regions have an impurity concentration different from each other.

According to another exemplary embodiment of the present invention, there is provided a method of fabricating a TFT comprising forming a polysilicon active layer on a substrate, forming a gate insulating layer to cover the active layer, and forming at least two gate electrodes on the gate insulating layer. The method further comprises doping impurities into the active layer on substrate on which the gate electrodes are formed to form a channel region on which the gate electrode is superposed, source and drain regions opposite to each other having the channel region between them, and at least two LDD regions between the source region and the channel region and between the drain region and the channel region. The LDD regions have an impurity concentration different from each other. Moreover, the method also comprises forming source and drain electrodes respectively connected to the source and drain regions.

According to another exemplary embodiment of the present invention, there is provided a method of fabricating a polysilicon TFT substrate comprising forming a TFT, which has a polysilicon active layer including a channel region, source and drain regions opposite to each other having the channel region between them, and at least two LDD regions formed between the source region and the channel region and between the drain region and the channel region, on a substrate. The LDD regions have an impurity concentration different from each other. The method further comprises forming a pixel electrode connected to the TFT.

BRIEF DESCRIPTION OF THE DRAWINGS

FIGS. 7A and 7B are cross-sectional views for explaining the process of forming the first gate electrode and the first LDD regions of the active layer shown in FIGS. 6A and 6B in more detail;

FIGS. 8A and 8B are a plan view and a cross-sectional view for explaining a process of forming the second gate electrode and the second LDD regions of the active layer shown in FIGS. 2 and 3;

FIGS. 9A, 9B and 9C are cross-sectional views for explaining the process shown in FIGS. 8A and 8B according to an exemplary embodiment of the present invention;

FIGS. 10A, 10B and 10C are cross-sectional views for explaining the process shown in FIGS. 8A and 8B according to an exemplary embodiment of the present invention;

DETAILED DESCRIPTION OF THE EXEMPLARY EMBODIMENTS OF THE INVENTION

Figure 1:
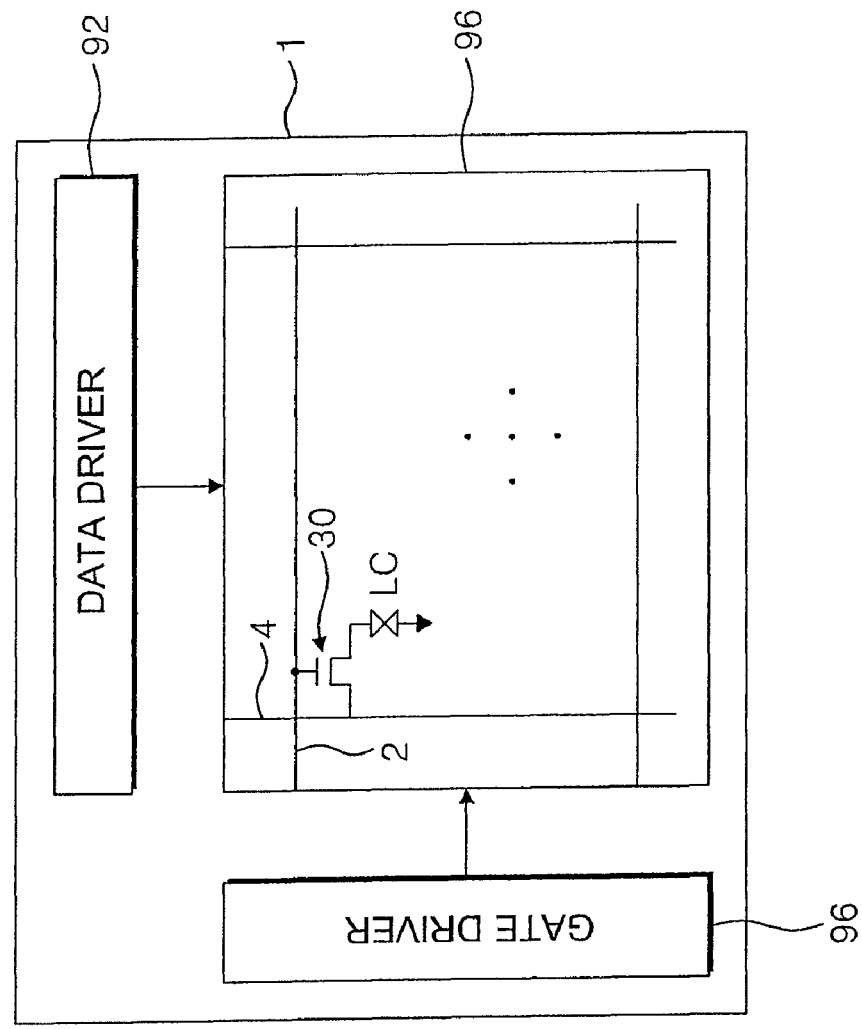
FIG. 1 roughly illustrates a conventional LCD panel using a polysilicon TFT.

The exemplary embodiments of the present invention will now be described more fully with reference to the accompanying drawings, in which exemplary embodiments of the invention are shown. The invention may, however, be embodied in many different forms and should not be construed as being limited to the embodiments set forth herein. Throughout the drawings, like reference numerals refer to like elements.

Figure 2:
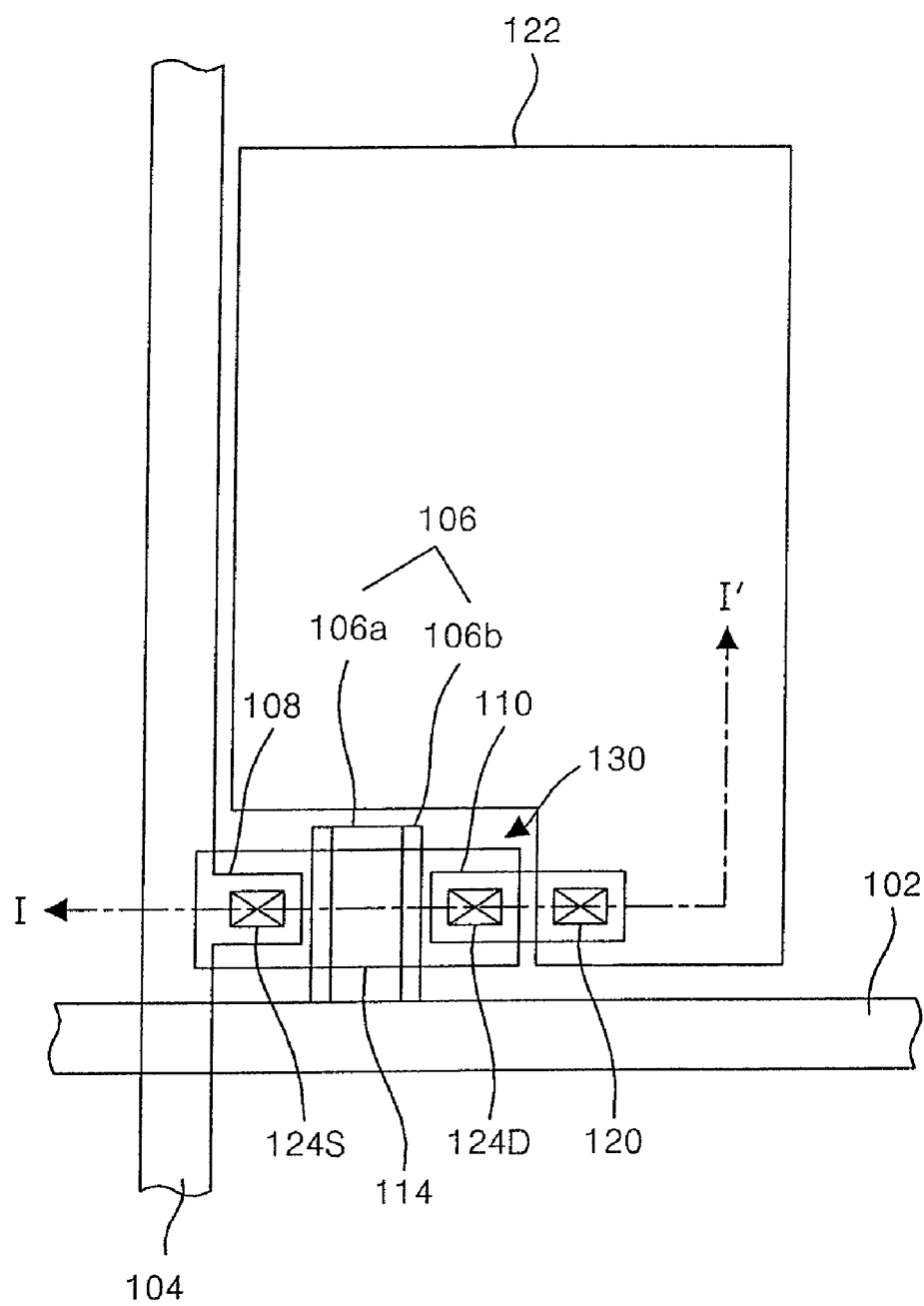
FIG. 2 is a plan view partially illustrating of a TFT substrate included in an LCD panel according to the present invention.
Figure 3:
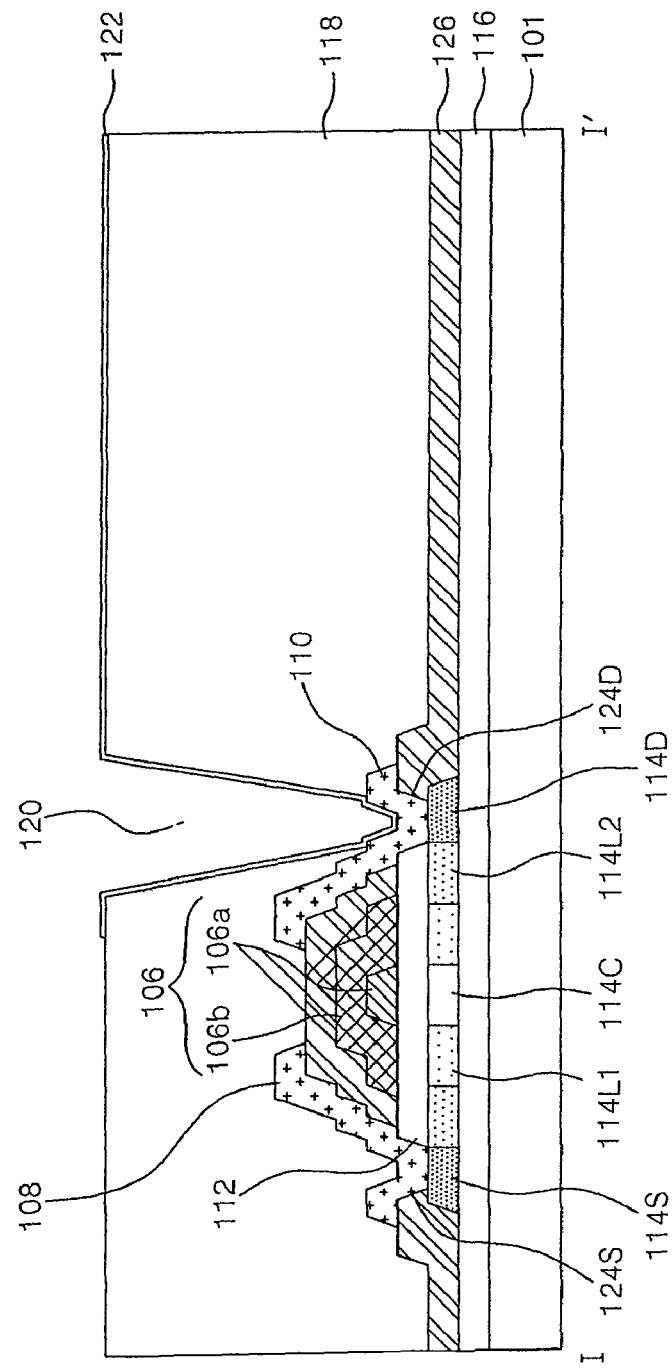
FIG. 3 is a cross-sectional view taken along the line I-I' of FIG. 2.

FIG. 2 is a plan view partially illustrating a polysilicon TFT substrate included in an LCD panel according to an exemplary embodiment of the present invention, and FIG. 3 is a cross-sectional view taken along the line I-I' of FIG. 2.

Referring to FIGS. 2 and 3, the polysilicon TFT substrate includes a TFT 130 connected to a gate line 102 and a data line 104, and a pixel electrode 122 connected to the TFT 130. The TFT 130 may be either an N type or P type. In the present exemplary embodiment, an N type TFT is used and will now be explained. The TFT 130 charges a video signal in the pixel electrode 122. The TFT 130 includes a gate electrode 106 connected to the gate line 102, a source electrode 108 connected to the data line 104, a drain electrode 110 connected to the pixel electrode 122 through a pixel contact hole 120 penetrating a passivation layer 118, and an active layer 114 forming a channel between the source and drain electrodes 108 and 110.

The active layer 114 is formed on a lower substrate 101 with a buffer layer 116 formed therebetween. The active layer 114 includes a channel region 114C, first and second lightly doped drain (LDD) regions 114L1, 114L1 and 114L2, 114L2, a source region 114S and a drain region 114D. A first gate electrode 106a is superposed on the channel region 114C, with a gate insulating pattern 112 formed therebetween. The source and drain regions 114S and 114D are located opposite to one another with the channel region 114C disposed therebetween. Moreover, the source and drain regions 114S and 114D are connected to the source and drain electrodes 108 and 110, respectively. The first LDD regions 114L1, 114L1 are opposite to each other with the channel region 114C located between them and doped with an N type impurity in a first concentration. A second gate electrode 106b is superposed on the first LDD regions 114L1, 114L1 such that the gate electrode 106 controls the resistance of the active layer 114. Thus, the TFT of the present exemplary embodiment provides a TFT which prevents deterioration of the reliability of the TFT typically caused by hot carriers injected into the gate insulating pattern 112. The TFT of the present exemplary embodiment also prevents the reduction of electron mobility caused by LDD resistance, thereby also increasing the ON current of the TFT 130.

The second LDD regions 114L2, 114L2 are formed between the source region 114S and one of the first LDD regions 114L1 and between the drain region 114D and the other first LDD regions 114L1 and are doped with an N type impurity in a second concentration higher than the first concentration used for the first LDD regions 114L1, 114L1. The second LDD regions 114L2, 114L2 reduce the intensity of the electric field applied to the boundaries of the channel region 114C and the source and drain regions 114S and 114D, thereby also decreasing the OFF current of the TFT 130.

The gate electrode 106 connected to the gate line 102 includes the first and second gate electrodes 106a and 106b. The first gate electrode 106a is superposed on the channel region 114C of the active layer 114 having the gate insulating pattern 112 formed therebetween. The second gate electrode 106b is superposed on the first LDD regions 114La of the active layer 114 having the gate insulating pattern 112 disposed therebetween and covers the first gate electrode 106a.

The source and drain electrodes 108 and 110 are superposed on the gate electrode 106 having an interlayer insulating film 126 disposed between them. The source electrode 108 coupled to the data line 104 is connected to the source region 114S of the active layer 114 through a source contact hole 124S penetrating the interlayer insulating film 126. The source region 114S is doped with an N type impurity in a third concentration higher than the second concentration used for the second LDD regions 114L2, 114L2. The drain electrode 110 is connected to the drain region 114D of the active layer 114 through a drain contact hole 124D penetrating the interlayer insulating film 126. The drain region 114D is doped with an N type impurity in the third concentration higher than the second concentration.

As described above, the polysilicon TFT substrate according to the exemplary embodiments of the present invention prevents electron mobility from being decreased due to a hot carrier effect caused by the first LDD regions and LDD resistance, and thus as a result the ON current of the TFT is thereby increased. Furthermore, the second LDD regions formed between the first LDD regions and the source and drain regions reduce the intensity of the electric field applied to the boundaries of the channel region and the source and drain regions, thereby as a result decreasing the OFF current of the TFT.

Figure 4A:
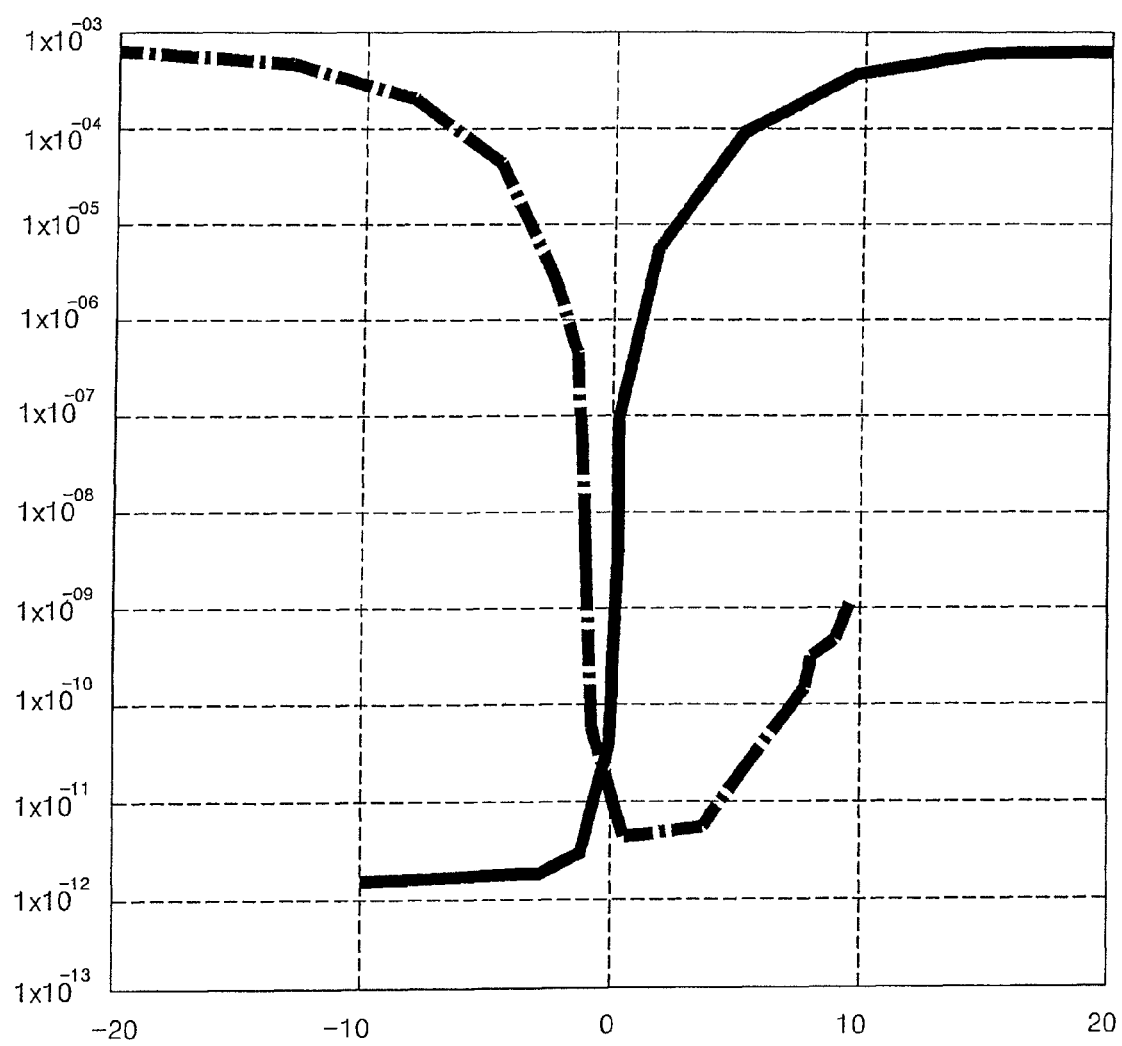
FIG. 4A is a graph showing the relationship between a gate voltage and ON/OFF current of a conventional LDD type TFT.
Figure 4B:
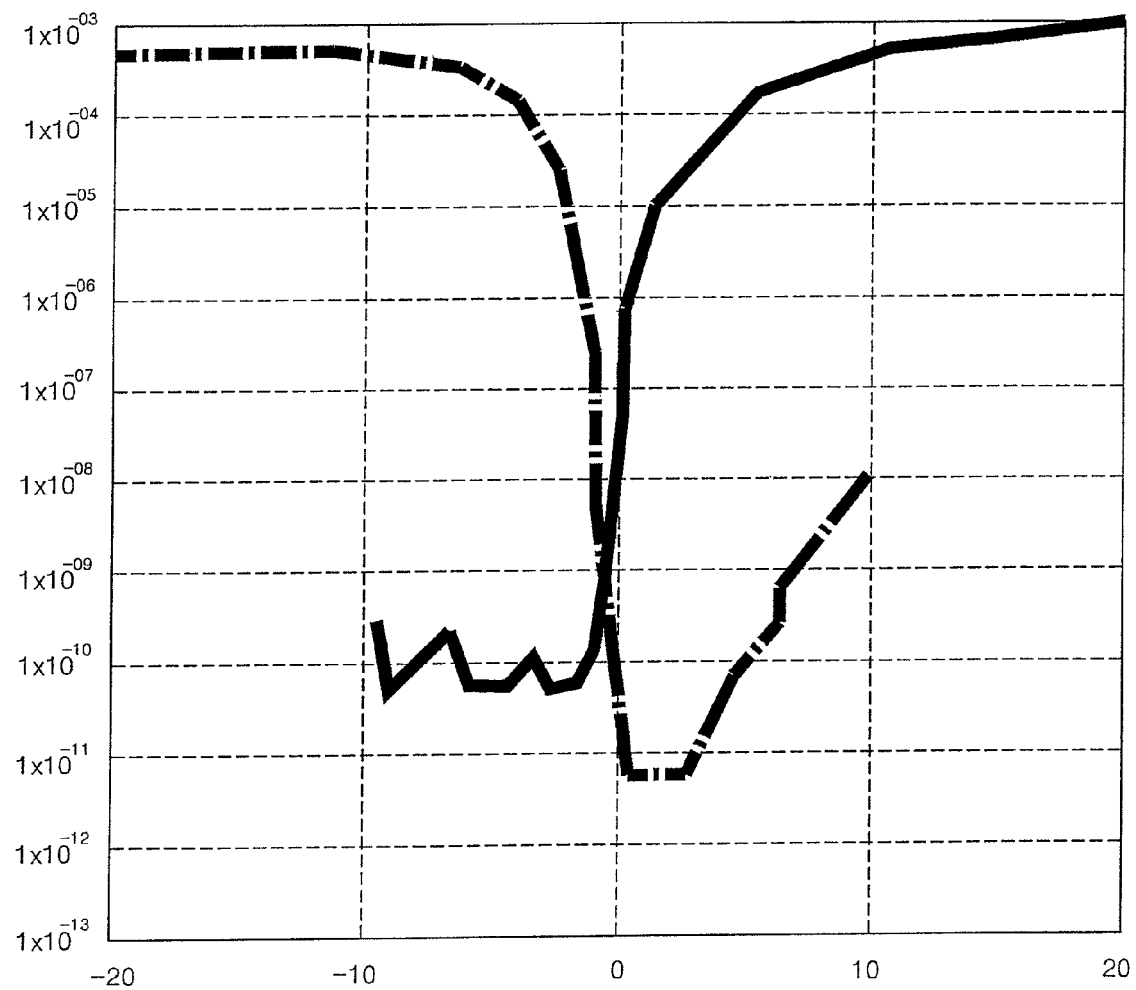
FIG. 4B is a graph showing the relationship between a gate voltage and ON/OFF current of a conventional GOLDD type TFT.
Figure 4C:
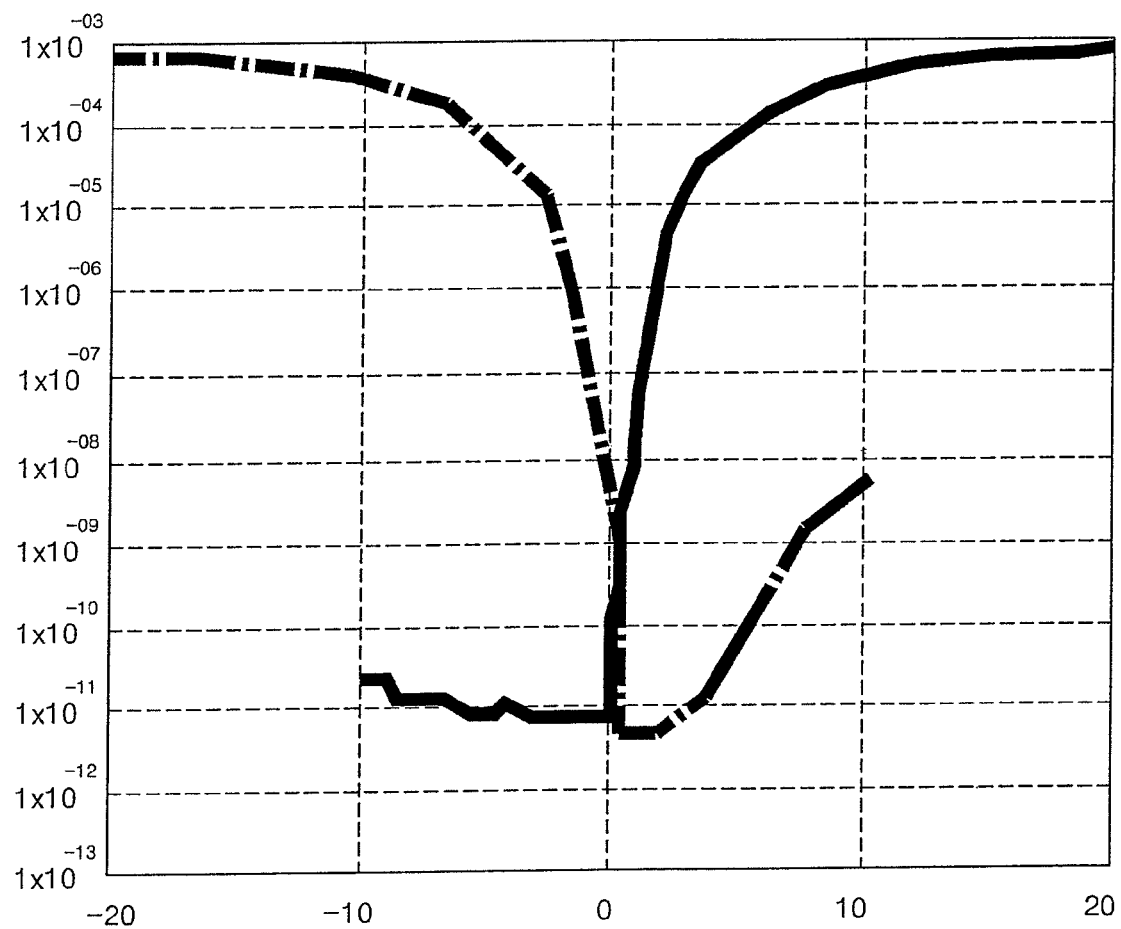
FIG. 4C is a graph showing the relationship between a gate voltage and ON/OFF current of a polysilicon TFT according to an exemplary embodiment of the present invention.

FIGS. 4A, 4B and 4C are graphs for comparing the characteristic of the TFT according to an exemplary embodiment of the present invention to conventional TFTs having an LDD and GOLDD (Gate Overlapped LDD) structures. In FIGS. 4A, 4B and 4C, the horizontal axes represent a gate voltage and vertical axes represent a drain current.

The conventional LDD type TFT includes LDD regions between the channel region and the source and drain regions. When the LDD type TFT is an N type TFT, OFF current of the TFT can be reduced to several pA, as shown in Table 1 and FIG. 4A. However, electron mobility is reduced due to the resistance of the LDD regions to decrease the ON current of the TFT to 800 μA.

The conventional GOLDD type TFT has LDD regions overlapped with the gate electrode. In the case of an N type GOLDD TFT, its ON current can be increased to 1 mA, as shown in Table 1 and FIG. 4B. However, the conventional GOLDD type TFT has a problem of high OFF current of several nA.

In the case of N type TFT according to an exemplary embodiment of the present invention, the first LDD regions overlapped with the second gate electrode increase the ON current of the TFT to several mA, as shown in Table 1 and FIG. 4C. Furthermore, the TFT according to the present exemplary embodiment reduces its OFF current to several pA according to the second LDD regions formed between the source and drain regions and the channel region.

TABLE 1

|  | LDD | GOLDD | Prevent invention |
| --- | --- | --- | --- |
| OFF current (Vg = −5 V) | Several pA | Several nA | Several pA |
| ON current (Vg = 20 V) | 800 μA | 1 mA | Several mA |

The polysilicon TFT substrate according to the present exemplary embodiment is fabricated using a process shown in FIGS. 5A through 14B.

Figure 5A:
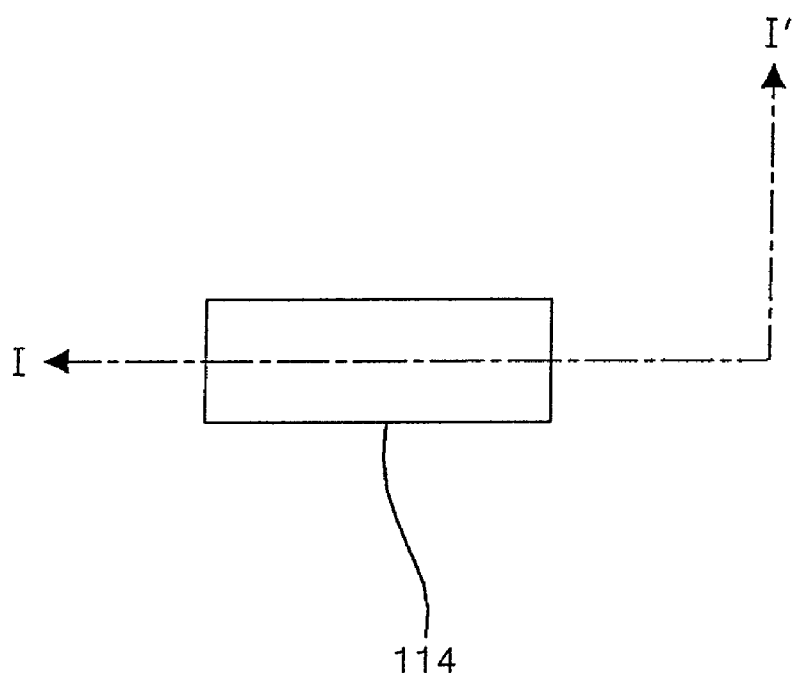
FIGS. 5A and 5B are a plan view and a cross-sectional view for explaining a process of forming the active layer shown in FIGS. 2 and 3.
Figure 5B:
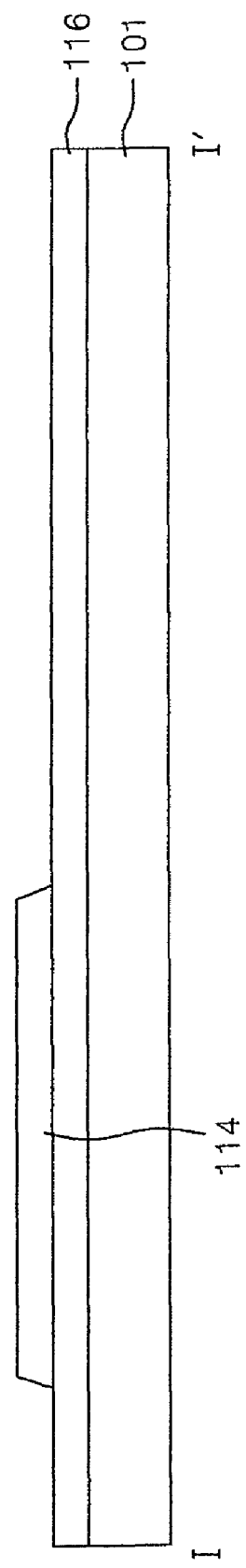

Referring to FIGS. 5A and 5B, the buffer layer 116 is formed on the lower substrate 101 and the active layer 114 is formed thereon. Specifically, the buffer layer 116 is formed in such a manner that an inorganic insulating material such as $SiO_2$ is deposited on the lower substrate 101. The active layer 114 is formed in a manner such that amorphous silicon is deposited on the buffer layer 116 and crystallized using a laser and thereby converted into polysilicon. The polysilicon layer is then patterned using photolithography and etching processes.

Figure 6A:
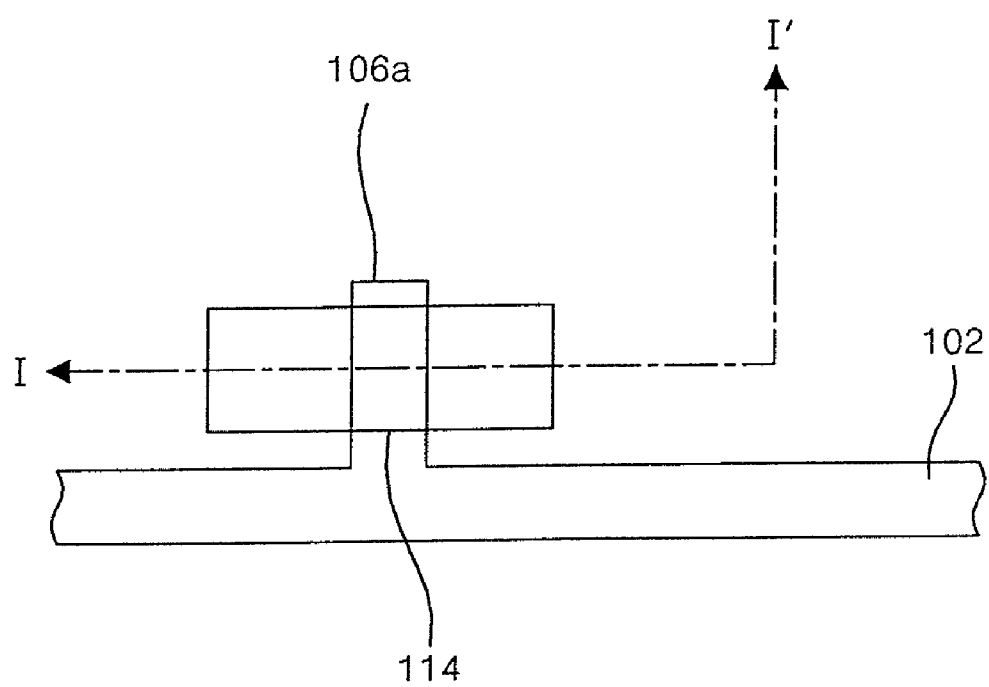
FIGS. 6A and 6B are a plan view and a cross-sectional view for explaining a process of forming the first gate electrode and the first LDD regions of the active layer shown in FIGS. 2 and 3.
Figure 6B:
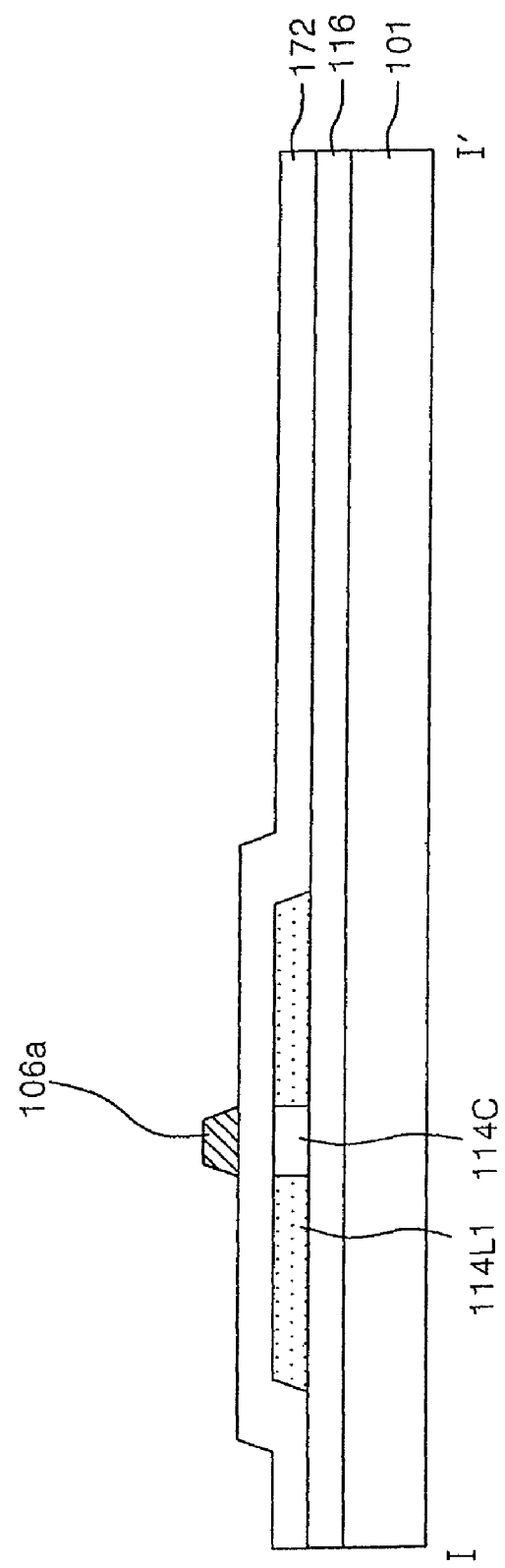
Figure 7A:
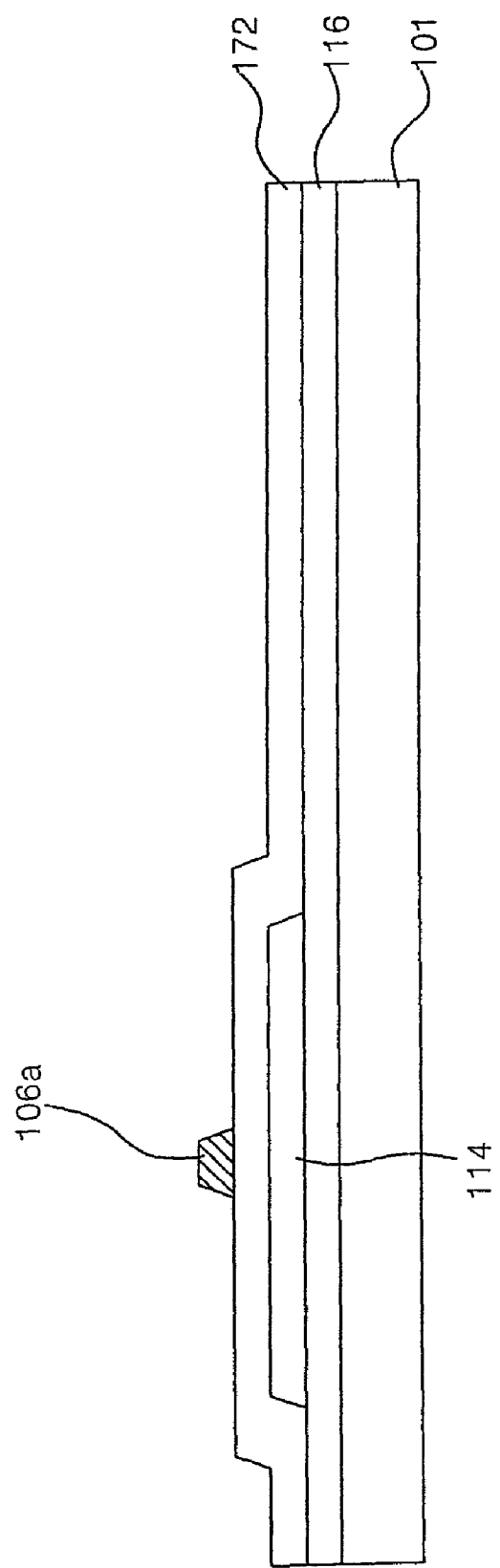

Referring to FIGS. 6A and 6B, a gate insulating layer 172 is formed on the buffer layer 116 on which the active layer 114 is formed, and the first gate electrode 106a is formed on the gate insulating layer 172. Referring to FIG. 7A, The gate insulating layer 172 is formed in a manner such that an inorganic insulating material such as $SiO_2$ is deposited on the buffer layer 116 on which the active layer 114 is formed. The first gate electrode 106a is formed in such a manner that a first gate metal layer is formed on the gate insulating layer 172 and then patterned using photolithography and etching processes. Here, the first gate electrode 106a is formed in a single layer structure composed of a metal selected from but not limited to aluminum (Al), aluminum neodymium (AlNd), chromium (Cr), copper (Cu), molybdenium (Mo), Tantalum (Ta) and tungsten (W) groups or a multi-layer structure composed of a combination of these metals. For example, the first gate electrode may be formed in a double-layer structure of AlNd/MoW.

Referring to FIG. 7B, an N type impurity is doped into the active layer 114 using the first gate electrode 106a as a mask to form the first LDD regions 114L1 on which the first gate electrode 106a is not superposed.

Figure 8A:
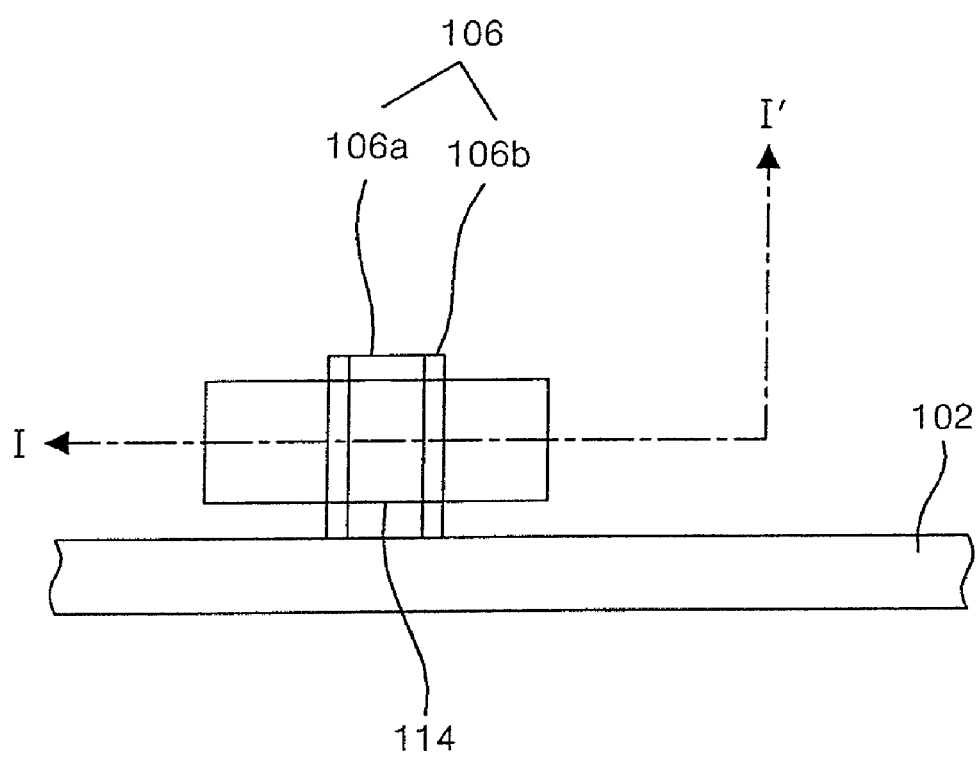

Referring to FIGS. 8A and 8B, the second gate electrode 106b is formed on the first gate electrode 106a. In addition, the second LDD regions 114L2, the source region 114S and the drain region 114D of the active layer are formed preferably by one of fabrication methods shown in FIGS. 9 and 10.

Figure 9A:
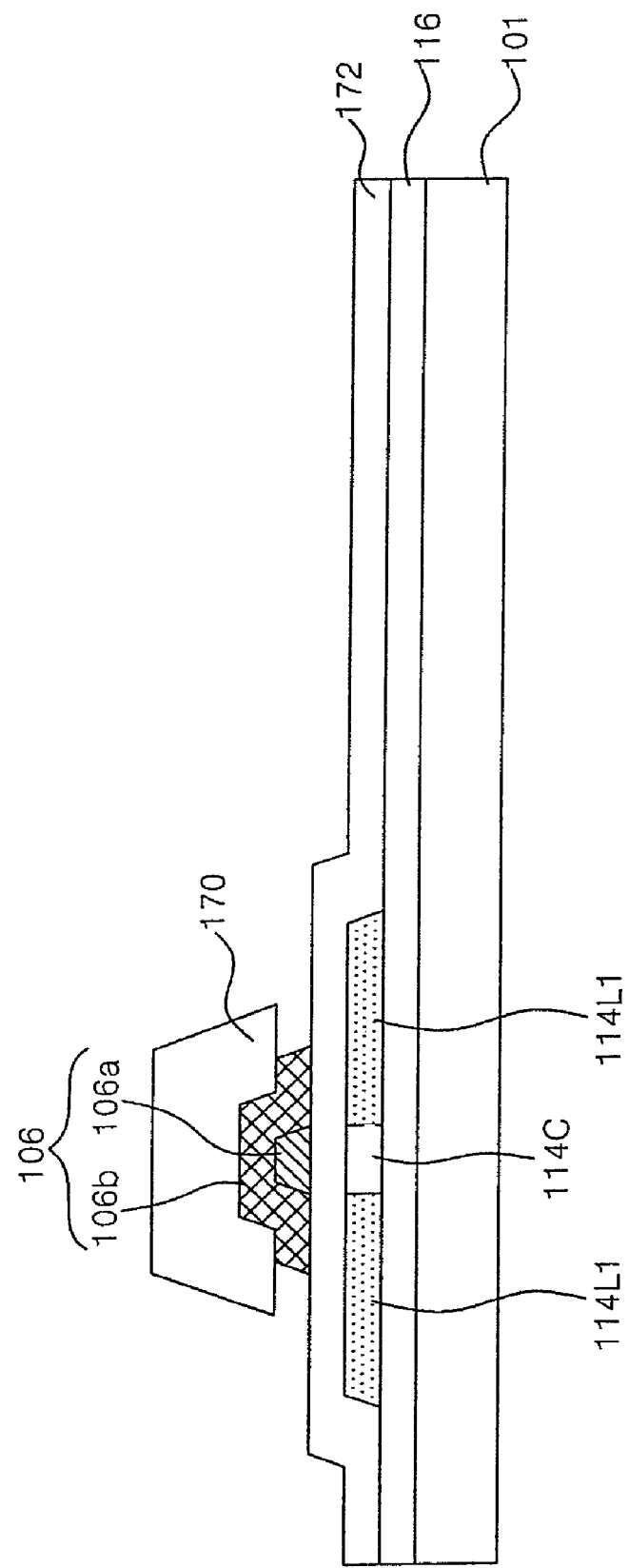

The fabrication method shown in FIGS. 9A, 9B and 9C is explained first. A second gate metal layer is formed on the lower substrate 101 on which the first gate electrode 106a is formed, and then a photoresist pattern 170 is formed on the second gate metal layer, as shown in FIG. 9A. The second gate metal layer is etched using the photoresist pattern 170 as a mask to form the second gate electrode 106b. Here, the second gate metal layer is over-etched such that the second gate electrode 106b has a width narrower than that of the photoresist pattern 179. Subsequently, the gate insulating layer 172 is etched using the photoresist pattern 170 as a mask to form the gate insulating pattern 112 having a width larger than that of the second gate electrode 106b, as shown in FIG. 9B. The gate insulating pattern 112 is formed such that it exposes parts of the first LDD regions 114L1, 114L1. An N type impurity is doped into the first LDD regions 114L1 using the gate insulating pattern 112 and the second gate electrode 106b as a mask to form the source region 114S, the drain region 114D and the second LDD regions 114L2, as shown in FIG. 9C. Here, the second LDD regions 114L2, 114L2 have an impurity concentration lower than those of the source and drain regions 114S and 114D due to the gate insulating pattern 112. In addition, the second LDD regions 114L2, 114L2 have an impurity concentration higher than that of the first LDD regions 114L1, 114L1 on which the second gate electrode 106b is superposed.

The fabrication process shown in FIGS. 10A, 10B and 10C will now be explained.

The second gate metal layer is formed on the lower substrate 101 on which the first gate electrode 106a is formed, and the photoresist pattern 170 is formed on the second gate metal layer using photolithography, as shown in FIG. 10A. The photoresist pattern 170 includes a first photoresist pattern 170a and a second photoresist pattern 170b lower than the first photoresist pattern 170a. The second gate metal layer and the gate insulating layer are patterned using the photoresist pattern 170 as a mask. Accordingly, the second gate electrode 106b and the gate insulating pattern 112 having essentially the same pattern as the second gate electrode 106b are formed. Here, the gate insulating pattern 112 is formed such that it exposes parts of the first LDD regions 114L1.

Subsequently, the photoresist pattern 170 is ashed in a manner such that the second photoresist pattern 170b is removed and the width and height of the first photoresist pattern 170a are decreased to expose parts of the second gate electrode 106b, as shown in FIG. 10B. The exposed second gate electrode 106b is patterned through an etching process using the ashed second photoresist pattern 170b as a mask. Accordingly, the second gate electrode 106b is formed such that the gate insulating pattern 112 is partially exposed.

Then, an N type impurity is doped into the first LDD regions 114L1 using the second gate electrode 106b and the gate insulating pattern 112 as a mask to form the source region 114S, the drain region 114D and the second LDD regions 114L2, 114L2 as shown in FIG. 10C. Here, the second LDD regions 114L2, 114L2 have an impurity concentration lower than those of the source and drain regions 114S and 114D due to the gate insulating pattern 112. Furthermore, the second LDD regions 114L2, 114L2 have an impurity concentration higher than that of the first LDD regions 114L1, 114L1 on which the second gate electrode 106b is superposed.

Figure 11A:
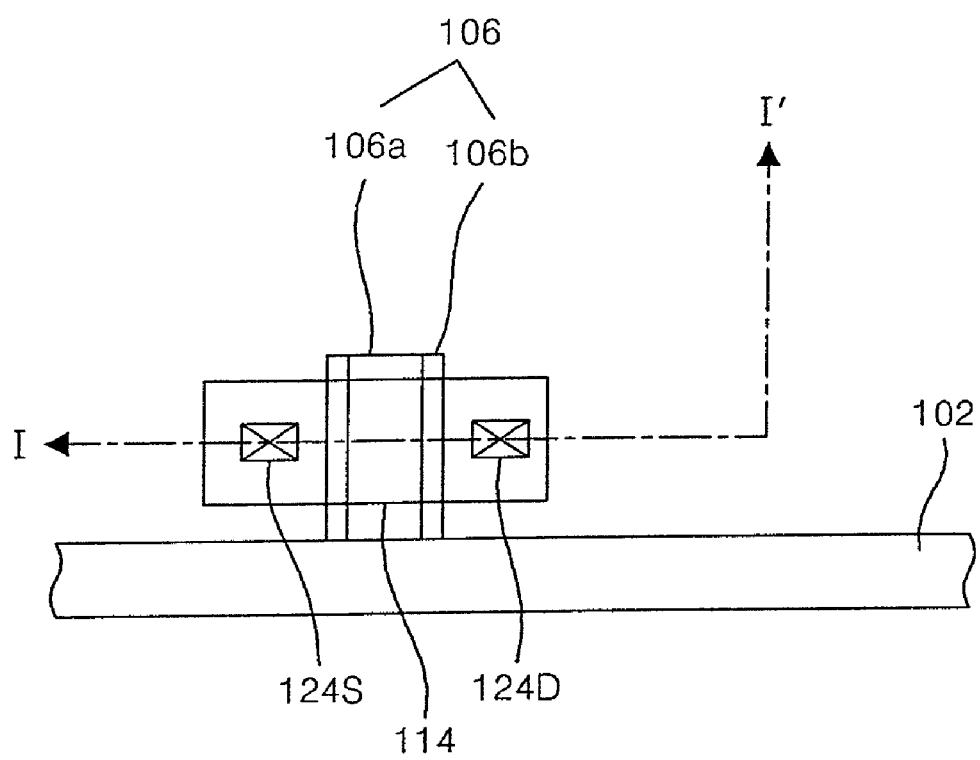
FIGS. 11A and 11B are a plan view and a cross-sectional view for explaining a process of forming the interlayer insulating film having source and drain contact holes shown in FIGS. 2 and 3.
Figure 11B:
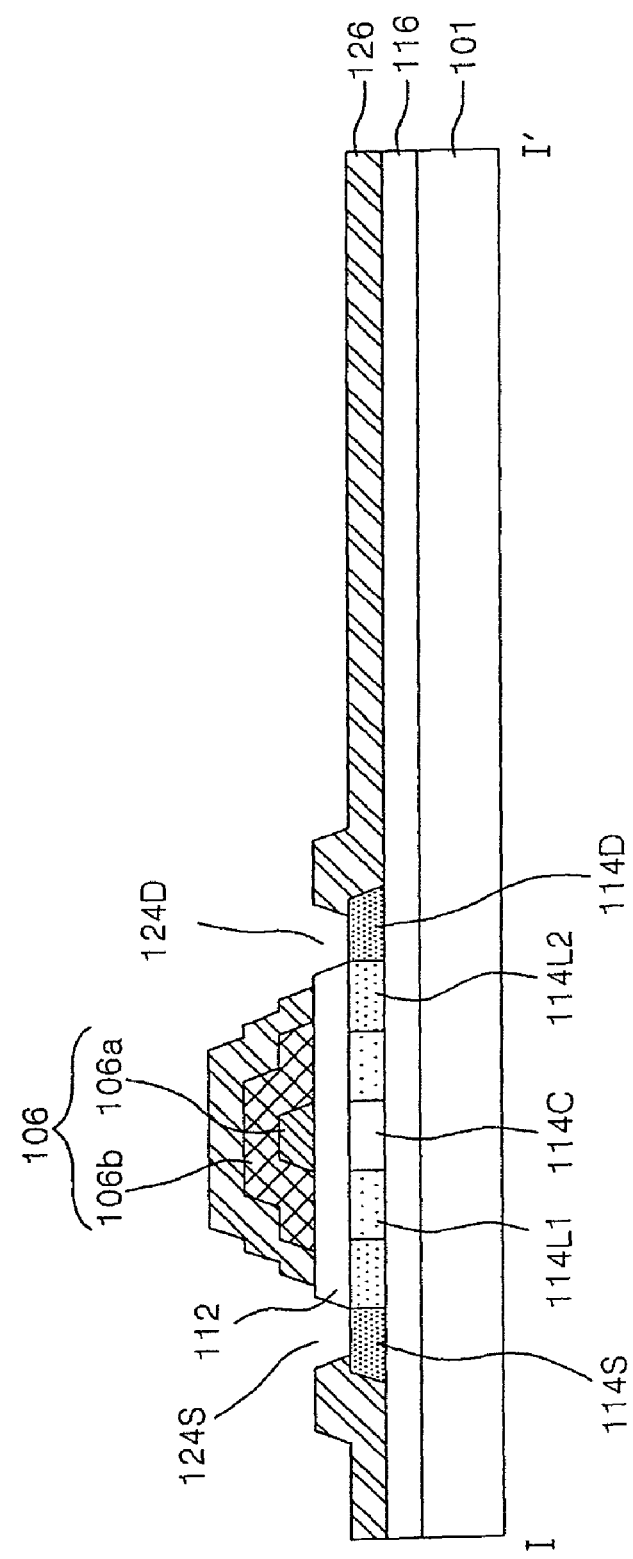

Referring to FIGS. 11A and 11B, the interlayer insulating film 126 having source and drain contact holes 124S and 124D is formed on the lower substrate 101 on which the gate electrode 106 is formed. The interlayer insulating film 126 is formed in such a manner that an inorganic insulating material such as SiO$_2$ is deposited on the lower substrate 101 on which the gate electrode 106 is formed.

Subsequently, the interlayer insulating film 126 or the interlayer insulating film 126 and the gate insulating pattern 112 are patterned using photolithography and etching processes to form the source and drain contact holes 124S and 124D respectively, thereby exposing the source and drain regions 114S and 114D of the active layer 114.

Figure 12A:
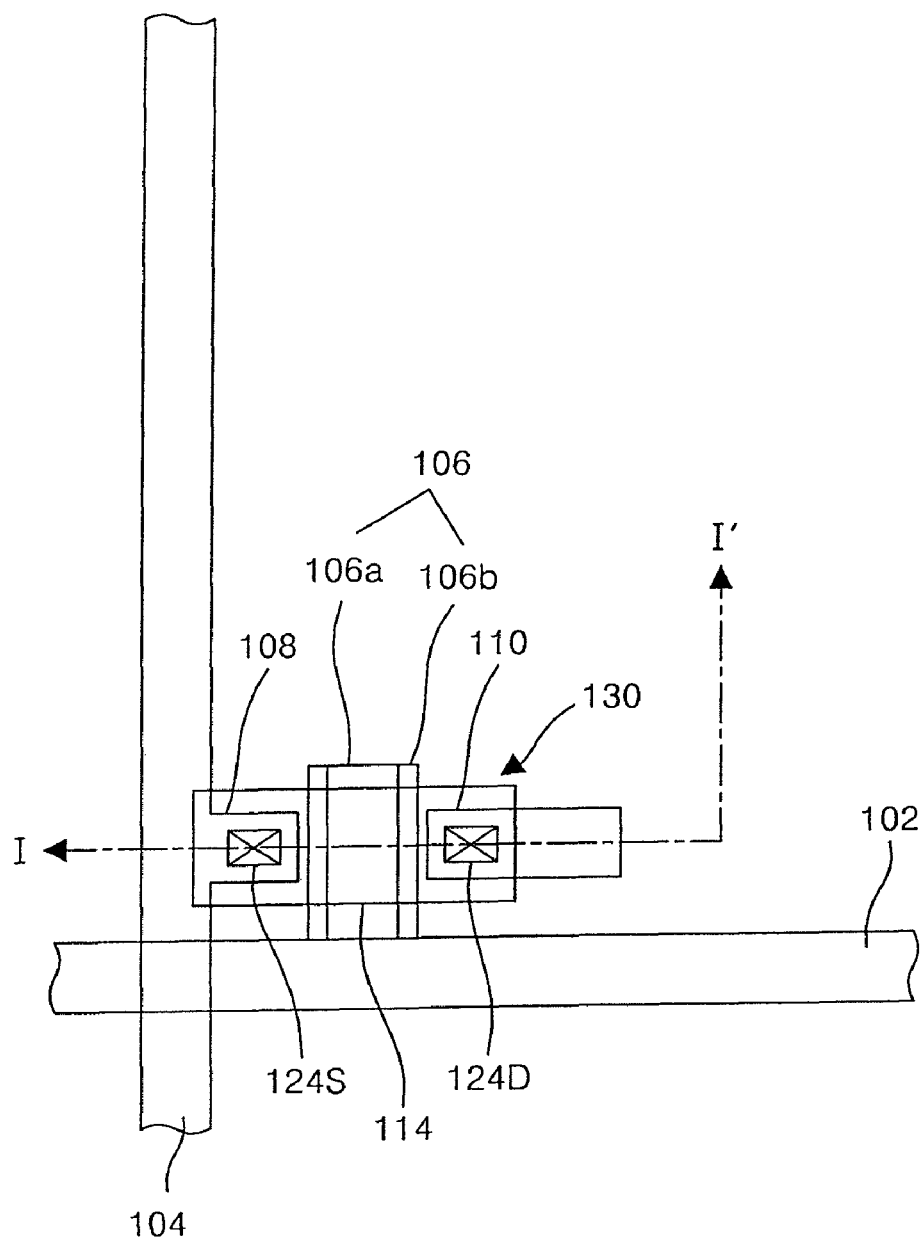
FIGS. 12A and 12B are a plan view and a cross-sectional view for explaining a process of forming the source and drain electrodes shown in FIGS. 2 and 3.
Figure 12B:
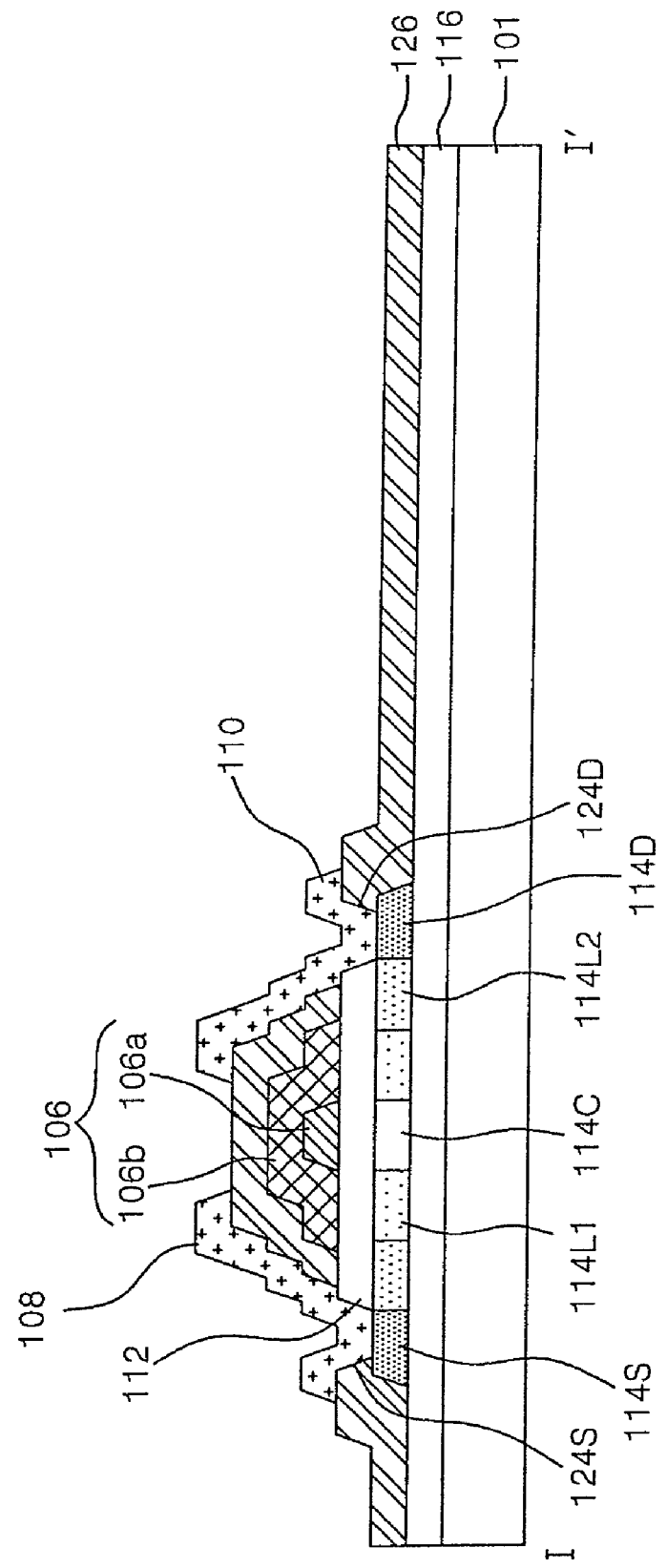

Referring to FIGS. 12A and 12B, the data line 104, the source electrode 108 and the drain electrode 110 are formed on the interlayer insulating film 126. Specifically, the data line 104 and the source and drain electrodes 108 and 110 are formed in such a manner that a source/drain metal layer is formed on the interlayer insulating film 126 and patterned using photolithography and etching processes. Here, the source and drain electrodes 108 and 110 are connected to the source and drain regions 114S and 114D of the active layer 1114 through the source and drain contact holes 124S and 124D, respectively.

Figure 13A:
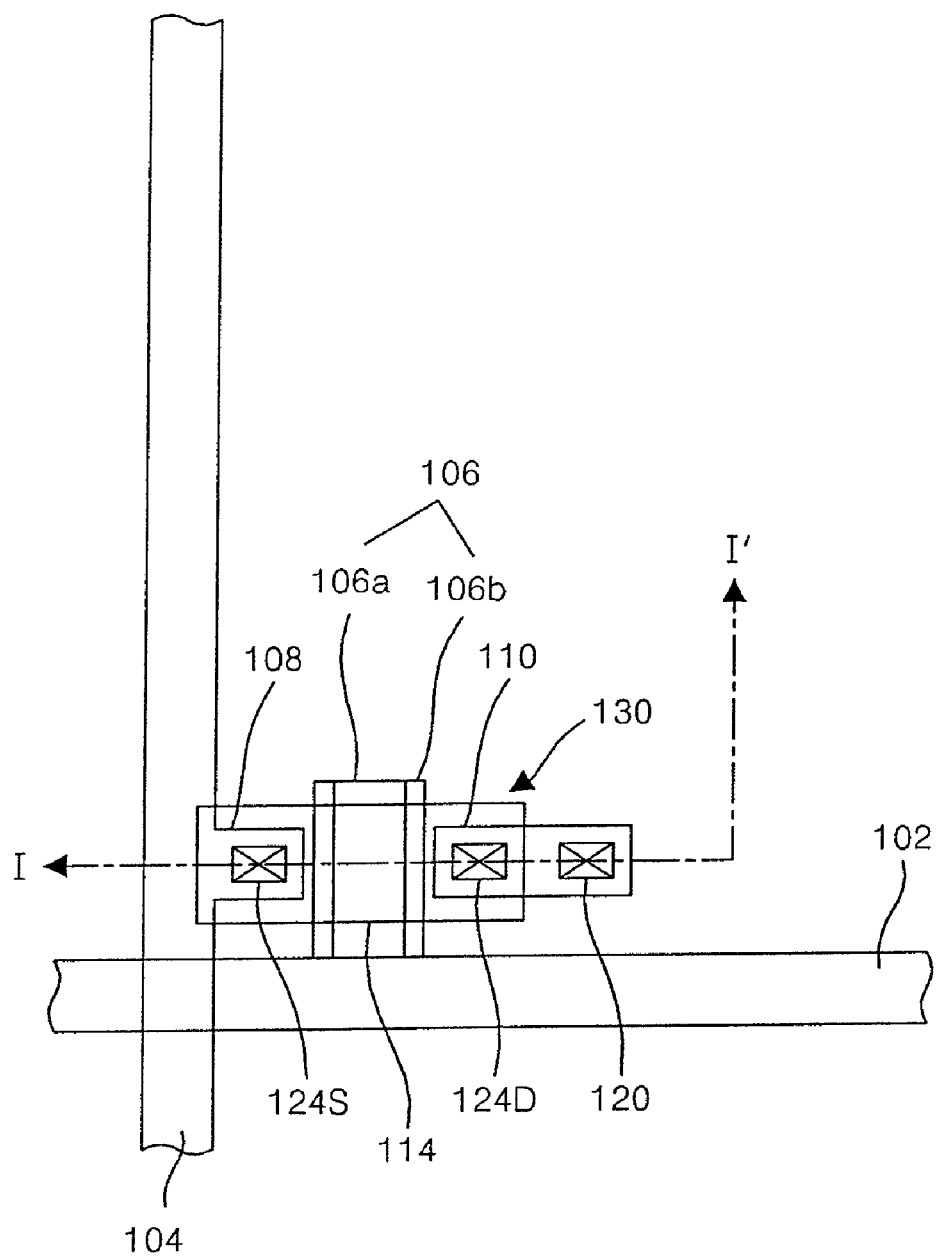
FIGS. 13A and 13B are a plan view and a cross-sectional view for explaining a process of forming the passivation layer having a pixel contact hole shown in FIGS. 2 and 3.
Figure 13B:
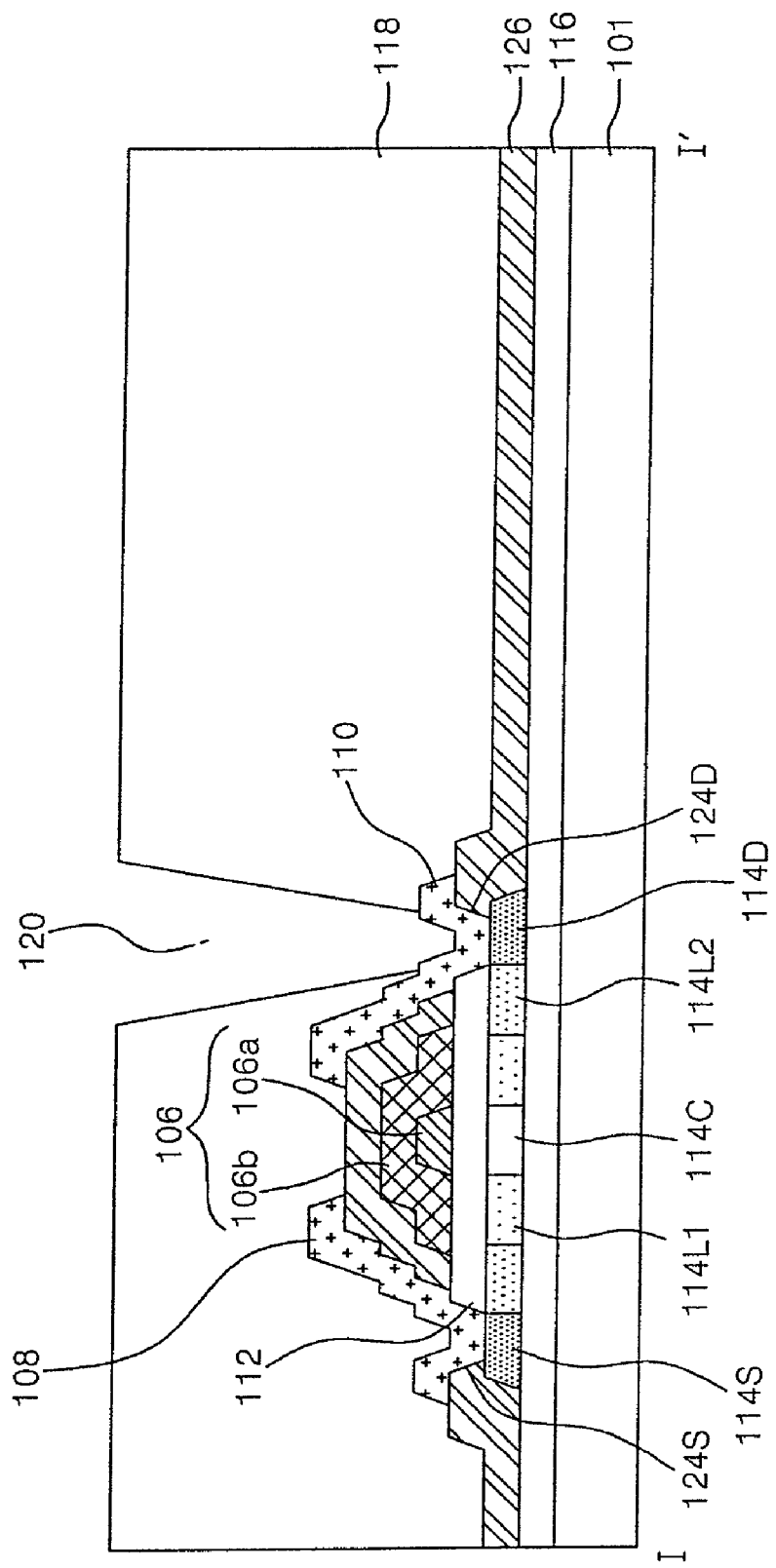

Referring to FIGS. 13A and 13B, the passivation layer 118 is formed on the interlayer insulating film 126 on which the source and drain electrodes 108 and 110 are formed, and the pixel contact hole 120 penetrating the passivation layer 118 is formed. The passivation layer 118 is formed in such a manner that an inorganic insulating material or an organic insulating material is deposited on the overall surface of the interlayer insulating film 126 on which the source and drain electrode 108 and 110 are formed. Then, the passivation layer 118 is patterned using photolithography and etching processes to form the pixel contact hole 120 penetrating the passivation layer 118 to expose the drain electrode 110 of the TFT 130.

Figure 14A:
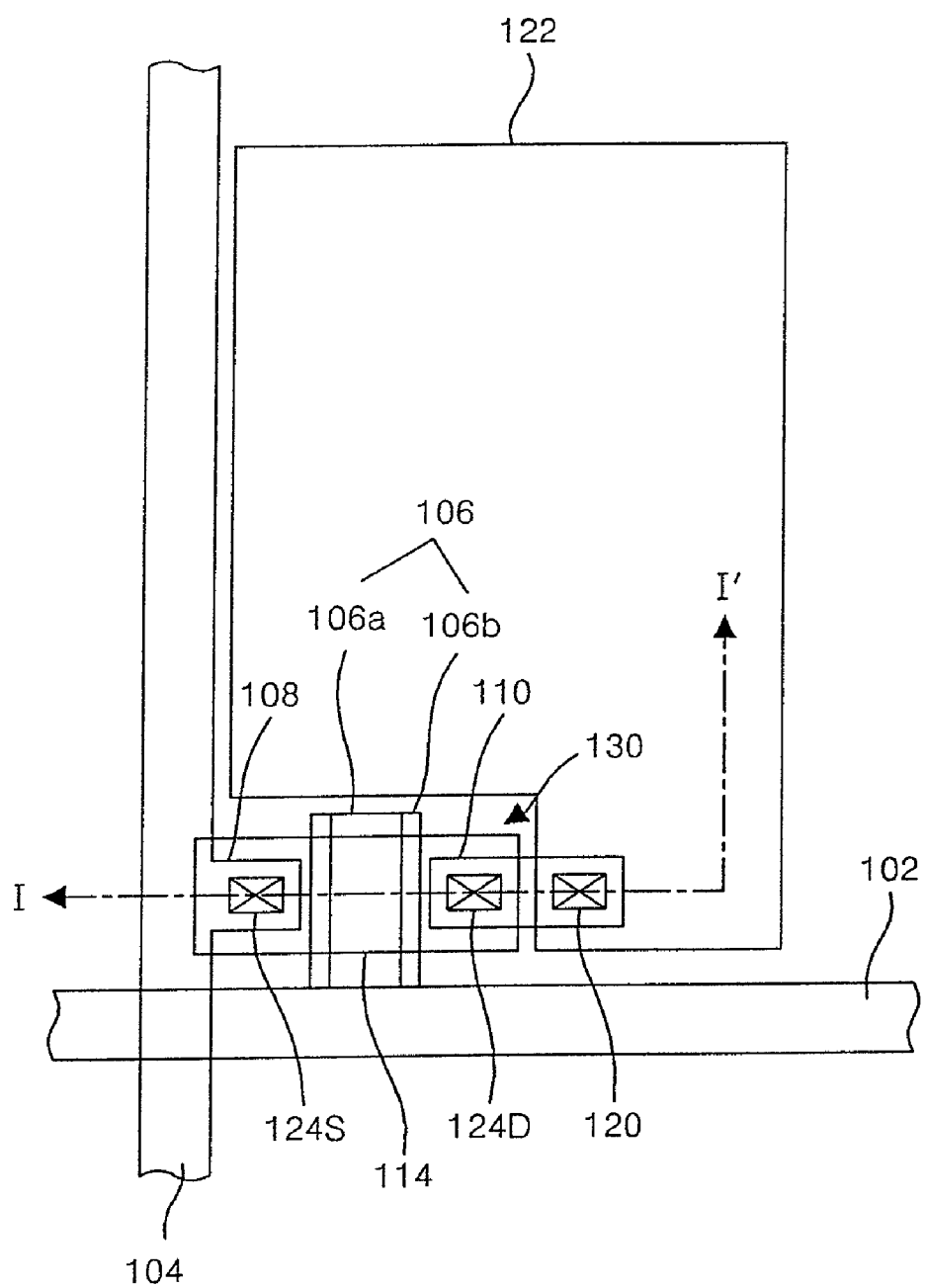
FIGS. 14A and 14B are a plan view and a cross-sectional view for explaining a process of forming the pixel electrode shown in FIGS. 2 and 3.
Figure 14B:
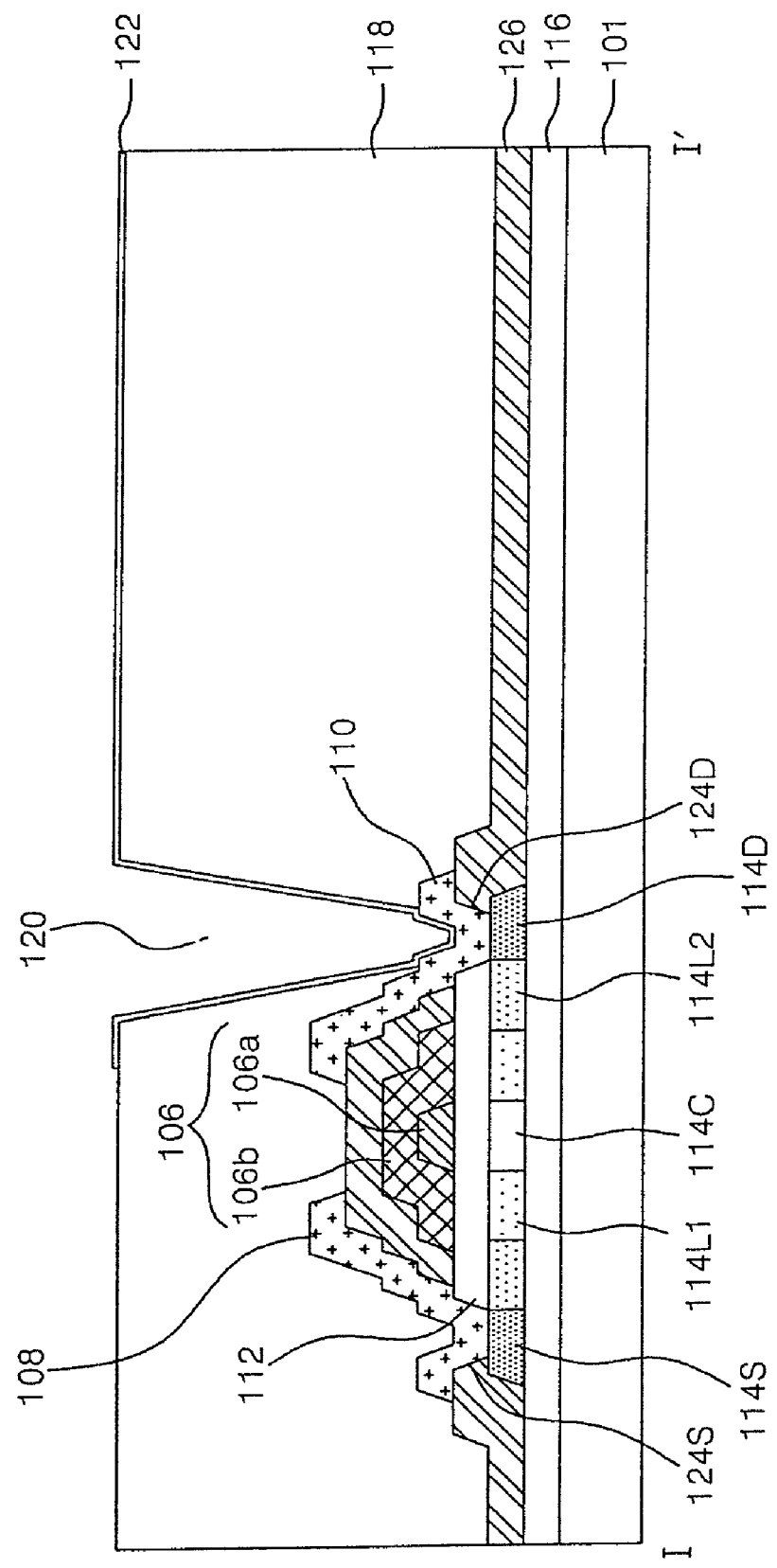

Referring to FIGS. 14A and 14B, the pixel electrode 122 is formed on the passivation layer 118. The pixel electrode 122 is formed in such a manner that a transparent conductive material such as ITO (Indium Tin Oxide), IZO (Indium Zinc Oxide) and ITZO (Indium Tin Zinc Oxide) is deposited on the passivation layer 118 and patterned using photolithography and etching processes. The pixel electrode 112 is connected to the drain electrode 110 of the TFT 130 via the pixel contact hole 120.

In addition, the TFT according to the exemplary embodiments of the present invention may also used as a transistor constructing the gate driver and the data driver.

Further, as described above, the TFT of the exemplary embodiments of the present invention protects the reliability of the TFT from being deteriorated by preventing electron mobility from being reduced due hot carriers and LDD resistance, thereby also causing the ON current of the TFT to increase. Furthermore, the present invention can reduce the intensity of the electric field applied to the boundaries of the channel region and the source and drain regions to reduce the OFF current of the TFT.

Having described the exemplary embodiments of the present invention, it is further noted that it is readily apparent to those of ordinary skill in the art that various modifications can be made therein without departing from the spirit and scope of the present invention as defined by the metes and bounds of the appended claims.

What is claimed is:

1. A method of fabricating a thin film transistor (TFT) comprising:
    forming a polysilicon active layer on a substrate;
    forming a gate insulating layer to cover the polysilicon active layer;
    forming a first gate electrode on the gate insulating layer;
    doping a first impurity into the polysilicon active layer to form a channel region on which the first gate electrode is superposed and a pair of first lightly doped drain (LDD) regions disposed at the both sides of the channel region;
    forming a second gate electrode on the first gate electrode to completely cover the first gate electrode;
    doping a second impurity into the polysilicon active layer to form a pair of second LDD regions having an impurity concentration higher than an impurity concentration of the first LDD regions, and source and drain regions opposite to each other interposing the channel region, the first LDD regions and the second LDD regions between them; and
    forming source and drain electrodes connected to the source and drain regions, respectively.

2. The method of claim 1, wherein the second gate electrode has a width larger than a width of the first gate electrode.

3. The method of claim 2, wherein the source and drain regions have an impurity concentration higher than the impurity concentration of the second LDD regions.

4. The method of claim 3, further forming a gate insulating pattern, the forming of the second gate electrode and the forming the gate insulating pattern comprising:
    forming a gate metal layer on the substrate on which the channel region and the first LDD regions are formed;
    forming a photoresist pattern on the gate metal layer;
    over-etching the gate metal layer such that the gate metal layer has a width narrower than a width of the photoresist pattern to form the second gate electrode; and
    etching the gate insulating layer using the photoresist pattern as a mask to form the gate insulating pattern having a width larger than a width of the second gate electrode.

5. The method of claim 3, further comprising forming a gate insulating pattern, the forming of the second gate electrode and the gate insulating pattern comprising:
    forming a gate metal layer on the substrate on which the channel region and the first LDD regions are formed;
    forming a stepped photoresist pattern on the gate metal layer;

etching the gate metal layer and the gate insulating layer using the stepped photoresist pattern as a mask to form the second gate electrode and the gate insulating pattern;

ashing the stepped photoresist pattern to expose parts of the second gate electrode; and etching the exposed second gate electrode using the ashed photoresist pattern as a mask.

6. A method of fabricating a thin film transistor (TFT) substrate comprising:

forming a polysilicon active layer on a substrate;

forming a gate insulating layer to cover the polysilicon active layer;

forming a first gate electrode on the gate insulating layer;

doping impurities into the polysilicon active layer to form a channel region and a pair of first LDD regions;

forming a second gate electrode completely covering the first gate electrode;

doping impurities into the polysilicon active layer to form a pair of second LDD regions having an impurity concentration higher than an impurity concentration of the first LDD regions, and source and drain regions having an impurity concentration higher than the impurity concentration of the second LDD regions;

forming an interlayer insulating film to cover the second gate electrode and exposing the source and drain regions;

forming source and drain electrodes connected to the exposed source and drain regions, respectively; and forming a pixel electrode connected to the drain electrode, wherein the first gate electrode superposes on the channel region.

7. The method of claim 6, wherein after the forming of the second gate electrode and prior to the forming of the pair of second LDD regions and the source and drain regions, further comprising:

forming a gate insulating pattern and wherein the second gate electrode has a width larger than a width of the first gate electrode.

8. The method of claim 7, wherein the forming of the second gate electrode and the gate insulating pattern comprises:

forming a gate metal layer on the substrate on which the channel region and the first LDD regions are formed;

forming a photoresist pattern on the gate metal layer;

over-etching the gate metal layer such that a width of the gate metal layer becomes narrower than a width of the photoresist pattern, to form the second gate electrode; and etching the gate insulating layer using the photoresist pattern as a mask to form the gate insulating pattern having a width larger than a width of the second gate electrode.

9. The method of claim 7, wherein the forming of the second gate electrode and the gate insulating pattern comprises:

forming a gate metal layer on the substrate on which the channel region and the first LDD regions are formed;

forming a stepped photoresist pattern on the gate metal layer;

etching the gate metal layer and the gate insulating layer using the stepped photoresist pattern as a mask to form the second gate electrode and the gate insulating pattern;

ashing the stepped photoresist pattern to expose parts of the second gate electrode; and etching the exposed second gate electrode using the ashed photoresist pattern as a mask.

10. The method of claim 6, further comprising forming a gate line on the substrate, forming a data line to cross the gate line on the substrate, and forming at least one of a gate driver for driving the gate line and a data driver for driving the data line, the at least one driver including a plurality of transistors, wherein the gate line and the data line are connected to the TFT.

11. The method of claim 10, wherein each of the transistors having a polysilicon active layer comprising a channel region, source and drain regions opposite to each other having the channel region disposed therebetween, and at least two LDD regions formed between the source region and the channel region and between the drain region and the channel region, the LDD regions having impurity concentration different from each other.

* * * * *